US008745761B2

(12) United States Patent
Mirkin et al.

(10) Patent No.: US 8,745,761 B2
(45) Date of Patent: Jun. 3, 2014

(54) FORCE FEEDBACK LEVELING OF TIP ARRAYS FOR NANOLITHOGRAPHY

(75) Inventors: Chad A. Mirkin, Wilmette, IL (US); Xing Liao, Evanston, IL (US); Adam B. Braunschweig, New York, NY (US)

(73) Assignee: Northwestern University, Evanston, IL (US)

( * ) Notice: Subject to any disclaimer, the term of this patent is extended or adjusted under 35 U.S.C. 154(b) by 851 days.

(21) Appl. No.: 12/960,439

(22) Filed: Dec. 3, 2010

(65) Prior Publication Data

US 2011/0165329 A1 Jul. 7, 2011

Related U.S. Application Data

(60) Provisional application No. 61/267,382, filed on Dec. 7, 2009, provisional application No. 61/292,444, filed on Jan. 5, 2010.

(51) Int. Cl.
*G01L 1/06* (2006.01)
*G01N 13/16* (2006.01)
*B05D 3/12* (2006.01)

(52) U.S. Cl.
USPC ............. 850/55; 977/773; 977/854; 427/256; 73/862.53

(58) Field of Classification Search
USPC ................... 850/55; 977/773, 854; 427/256; 73/862.53
See application file for complete search history.

(56) References Cited

U.S. PATENT DOCUMENTS 5,472,881 A 12/1995 Beebe et al.
5,776,748 A 7/1998 Singhvi et al.
5,846,909 A 12/1998 McDevitt et al.
5,908,692 A 6/1999 Hamers et al.
5,942,397 A 8/1999 Tarlov et al.

(Continued)

FOREIGN PATENT DOCUMENTS

WO WO-99/48682 A1 9/1999
WO WO-2005/115630 A2 12/2005

(Continued)

OTHER PUBLICATIONS

Allara et al., Spontaneously organized molecular assemblies. 1. Formation, dynamics and physical properties of n-Alkanoic acids adsorbed from solution on an oxidized aluminum surface, *Langmuir*, 1: 45 (1985).

(Continued)

*Primary Examiner* — Nikita Wells
(74) *Attorney, Agent, or Firm* — Marshall, Gerstein & Borun LLP

(57) ABSTRACT

A method of leveling a polymer pen array includes contacting a pen array with a surface and measuring a total force exerted on the surface by the pen array, the pen array being disposed at a first angle with respect to a first axis of the surface and a second angle with respect to a second axis of the surface; tilting one or both of the pen array and the surface to vary the first and second angles of the pen array with respect to the surface; measuring the total force exerted by the tilted pen array on the surface; and repeating the tilting and measuring steps until a global maximum of the total force exerted on the surface by the pen array is measured, thereby determining first and second angles which correspond to a leveled position of the pen array with respect to the surface.

41 Claims, 13 Drawing Sheets

(56) References Cited

U.S. PATENT DOCUMENTS

| | | | |
|---|---|---|---|
| 6,500,549 B1 | 12/2002 | Deppisch et al. | |
| 6,596,346 B2 | 7/2003 | Bernard et al. | |
| 6,635,311 B1 | 10/2003 | Mirkin et al. | |
| 2004/0228962 A1 | 11/2004 | Liu et al. | |
| 2008/0105042 A1 | 5/2008 | Mirkin et al. | |
| 2008/0309688 A1 | 12/2008 | Haaheim et al. | |
| 2009/0205091 A1 | 8/2009 | Haaheim et al. | |
| 2011/0132220 A1* | 6/2011 | Mirkin et al. | 101/483 |
| 2011/0305996 A1* | 12/2011 | Mirkin et al. | 430/324 |
| 2012/0097058 A1* | 4/2012 | Mirkin et al. | 101/483 |
| 2013/0040856 A1* | 2/2013 | Mirkin et al. | 506/11 |

FOREIGN PATENT DOCUMENTS

| | | |
|---|---|---|
| WO | WO-2009/132321 A1 | 10/2009 |
| WO | WO-2010/096591 A2 | 8/2010 |
| WO | WO-2010/096593 A2 | 8/2010 |

OTHER PUBLICATIONS

Allara et al., The study of the gas-solid interaction of acetic acid with a cuprous oxide surface using reflection-absorption spectroscopy, *J. Colloid Interface Sci.*, 49: 410-21 (1974).

Anwander et al., Surface characterization and functionalization of MCM-41 silicas via silazane silylation, *J. Phys. Chem. B*, 104:3532-44 (2000).

Bain et al., A new class of self-assembled monolayers: organic thiols on gallium arsenide, *Adv. Mater.*, 4:591-4 (1992).

Bansal et al., Electrochemical properties of (111)-oriented n-Si surfaces derivatized with covalently-attached alkyl chains, *J. Phys. Chem. B*, 102:1067-70 (1998).

Bansal et al., Stabilization of Si photoanodes in aqueous electrolytes through surface alkylation, *J. Phys. Chem. B.*, 102:4058-60 (1998).

Bernard et al., Printing patterns of proteins, *Langmuir*, 14:2225-9 (1998).

Bishop et al., Self-assembled monolayers: Recent developments and applications, *Curr. Opin. Colloid & Interface Sci.*, 1:127-36 (1996).

Brazdil et al. Resonance raman spectra of adsorbed species at solid-gas interfaces. 2. ρ-Nitrosodimethylaniline and ρ-Dimethylaminoazobenzene adsorbed on semiconductor oxide surfaces, *J. Phys. Chem.*, 85, 1005-14 (1981).

Burwell, Modified silica gels as adsorbents and catalysts, *Chem. Technol.*, 4: 370-7 (1974).

Calvert, Lithographic patterning of self-assembled films, *J. Vac. Sci. Technol. B*, 11:2155-63 (1993).

Chang et al., Structures of self-assembled monolayers of aromatic-derivatized thiols on evaporated gold and silver surfaces: implication on packing mechanism, *J. Am. Chem. Soc.*, 116, 6792-805 (1994).

Chen et al., regiocontrolled synthesis of poly(3-alkylthiophenes) mediated by rieke zinc: their characterization and solid-state properties, *J. Am. Chem. Soc.*, 117:233-44 (1995).

Chen et al., Do alkanethiols adsorb onto the surfaces of Tl-Ba-Ca-Cu-O-based high-temperature superconductors? The critical role of H₂0 content on the adsorption process, *Langmuir*, 12:2622-4 (1996).

Chen et al., Synthesis and characterization of carboxylate-modified gold nanoparticle powders dispersible in water, *Langmuir*, 15:1075-82 (1999).

Chidsey, Book of Abstracts, 214th ACS National Meeting, Las Vegas, Nev., Sep. 7-11, 1997, I&EC-027.

Dammel, *Diazonaphthoquinone Based Resists*, 1st ed., SPIE Optical Engineering Press, Bellingham, Wash. (1993).

Donzel et al., Hydrophilic poly(dimethylsiloxane) stamps for microcontact printing, *Adv. Mater.*, 13:1164-7 (2001).

Dubois et al., Synthesis, structure, and properties of model organic surfaces, *Phys. Chem.*, 43:437-63 (1992).

Ellison et al., Adsorption of phenyl isothiocyanate on Si(001): A 1,2-dipolar surface addition reaction, *J. Phys. Chem. B*, 103:6243-51 (1999).

Ellison et al., Cycloaddition chemistry on silicon(001) surfaces: the adsorption of azo-tert-butane, *J. Phys. Chem. B*, 102:8510-8 (1998).

Eltekova et al., Adsorption of aromatic compounds from solutions on titanium dioxide and silica, *Langmuir*, 3:951-7 (1987).

Fenter et al., Structure of $CH_3(CH_2)_{17}SH$ self-assembled on the Ag(111) surface: an incommensurate monolayer, *Langmuir*, 7:2013-6 (1991).

Grabar et al., Preparation and characterization of Au colloid monolayers, *Anal Chem*, 67 : 735-743 (1995).

Gu et al., Electron tunneling at the semiconductor-insulator-electrolyte interface. Photocurrent studies of the n-InP-alkanethiol-ferrocyanide system, *J. Phys. Chem. B*, 102:9015-28 (1998).

Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, *Langmuir*, 7:955-63 (1991).

Hamers et al., Formation of ordered, anisotropic organic monolayers on the Si(001) surface, *J. Phys. Chem. B*, 101:1489-92 (1997).

He et al., Preparation of hydrophilic poly(dimethylsiloxane) stamps by plasma-induced grafting, *Langmuir*, 19:6982-6 (2003).

Henderson et al., Self-assembled monolayers of ithiols, diisocyanides, and isocyanothiols on gold: "chemically sticky" surfaces for covalent attachment of metal clusters and studies of interfacial electron transfer, *Inorg. Chim. Acta*, 242:115-24 (1996).

Hickman et al., Combining spontaneous molecular assembly with microfabrication to pattern surfaces: selective binding of isonitriles to platinum microwires and characterization by electrochemistry and surface spectroscopy, *J. Am. Chem. Soc.*, 111: 7271-72 (1989).

Hickman et al., Toward orthogonal self-assembly of redox active molecules on Pt and Au: selective reaction of disulfide with Au and isocyanide with Pt, *Langmuir*, 8, 357-9 (1992).

Hovis et al., Cycloaddition chemistry and formation of ordered organic monolayers on silicon (001) surfaces, Surf. Sci., 402-404:1-7 (1998).

Hovis et al., Cycloaddition chemistry of 1,3-dienes on the silicon(001) surface: Competition between [4 + 2] and [2 + 2] reactions, *J. Phys. Chem. B*, 102:6873-9 (1998).

Hovis et al., Structure and bonding of ordered organic monolayers of 1,5-cyclooctadiene on the silicon(001) surface, *J. Phys. Chem. B*, 101:9581-5 (1997).

Hubbard, Electrochemistry of well-defined surfaces, *Acc. Chem. Res.*, 13:177-184 (1980).

Huc et al., Self-assembled mono- and multilayers on gold from 1,4-diisocyanobenzene and ruthenium phthalocyanine, *J. Phys. Chem. B*, 103: 10489-95 (1999).

Iler, *The Chemistry of Silica*, Chapter 6, New York: Wiley (1979).

James et al., Patterned protein layers on solid substrates by thin stamp microcontact printing, *Langmuir*, 14, 741-4 (1998).

Laibinis et al., ω-Terminated alkanethiolate monolayers on surfaces of copper, silver, and gold have similar wettabilities, *J. Am. Chem. Soc.*, 114, 1990-5 (1992).

Laibinis et al., Comparisons of self-assembled monolayers on silver and gold: mixed monolayers derived from $HS(CH_2)_{21}X$ and $HS(CH_2)_{10}Y$ (X, Y = $CH_3$, $CH_2OH$) have similar properties, *Langmuir*, 7:3167-73 (1991).

Lee et al., Adsorption of ordered zirconium phosphonate multilayer films on silicon and gold surfaces, *J. Phys. Chem.*, 92 : 2597-601 (1988).

Li et al., Self-assembly of *n*-alkanethiolate monolayers on silver nanostructures: determination of the apparent thickness of the monolayer by scanning tunneling microscopy, *J. Phys. Chem.*, 98, 11751-5 (1994).

Li et al., Self assembly of n-alkanethiolate monolayers on silver nano-structures: determination of the apparent thickness of the monolayer by scanning tunneling microscopy, Technical Report No. 2, Office of Naval Research,, 24 pp (1994).

Lo et al., Polypyrrole growth on $YBa_2Cu_3O_{7-\delta}$ modified with a self-assembled monolayer of N-(3-aminopropyl)pyrrole: hardwiring the "electroactive hot spots" on a superconductor electrode, *J. Am. Chem. Soc.*, 118:11295-6 (1996).

Lunt et al., Chemical studies of the passivation of GaAs surface recombination using sulfides and thiols, *J. Appl. Phys.*, 70:7449-67 (1991).

(56) References Cited

OTHER PUBLICATIONS

Lunt et al., Passivation of GaAs surface recombination with organic thiols, *J. Vacuum Sci. Technol. B*, 9:2333-6 (1991).

Magallon et al., Book of Abstracts, 215th ACS National Meeting, Dallas, Mar. 29-Apr. 2, 1998, COLL-048.

Maoz et al., Penetration-controlled reactions in organized monolayers assemblies. 2. Aqueous permanganate interaction with self-assembling monolayers of long-chain surfactants, *Langmuir*, 3:1045-51 (1987).

Martin et al., Direct protein microarray fabrication using a hydrogel "stamper", *Langmuir*, 14:3791-5 (1998).

Matteucci et al., Synthesis of deoxyoligonucleotides on a polymer support, *J Am Chem Soc*, 103:3185-91 (1981).

Mayya et al., A study of the partitioning of colloidal particles based on their size during electrostatic immobilization at the air-water interface using fatty amine monolayers, *J. Phys. Chem. B*, 101, 9790-3 (1997).

Menzel et al., Surface-confined nanoparticles as substrates for photopolymerizable self-assembled monolayers, *Adv. Mater.*, 11:131-4 (1999).

Meyer et al., Evidence for adduct formation at the semiconductor-gas interface. Photoluminescent properties of cadmium selenide in the presence of amines, *J. Am. Chem. Soc.*, 110: 4914-18 (1988).

Mirkin et al., Controlling the surface properties of high temperature superconductors, *Adv. Mater.*, 9:167-73 (1997).

Mucic et al., Synthesis and characterization of DNA with ferrocenyl groups attached to their 5'-termini: electrochemical characterization of a redox-active nucleotide monolayer, *Chem Commun*, 555-557 (1996).

Nakagawa et al., GaAs interfaces with octadecyl thiol self-assembled monolayer: structural and electrical properties, *Japan J. Appl. Phys. Part I*, 30:3759-62 (1991).

Nuzzo et al., Spontaneously organized molecular assemblies. 3. Preparation and properties of solution adsorbed monolayers of organic disulfides on gold surfaces, *J Am Chem Soc*, 109:2358-2368 (1987).

Ohno et al., Nanostructural formation of self-assembled monolayer films on cleaved AlGaAs/GaAs heterojuctions, *Mol. Crystal Liq. Crystal Sci. Technol. A*, 295:487-90 (1997).

Patil et al., Surface derivatization of colloidal silver particles using interdigitized bilayers: a novel strategy for electrostatic immobilization of colloidal particles in thermally evaporated fatty acid/fatty amine films, *Langmuir*, 14, 2707-11 (1998).

Pereira et al., Modification of surface properties of alumina by plasma treatment, *J. Mater. Chem.*, 10, 259-61 (2000).

Porter et al., Gold and silver nanoparticles functionalized by the adsorption of dialkyl disulfides, *Langmuir*, 14, 7378-86 (1998).

Reuter et al., Effects of gallium arsenide passivation on scanning tunneling microscope excited luminescence, *Mater. Res. Soc. Symposium Proceedings*, 380:119-24 (1995).

Sangiorgi et al., Adsorption of 1-decylamine on copper, *Gazz. Chim. Ital.*, 111:99-102 (1981).

Sastry et al., Langmuir-blodgett films of carboxylic acid derivatized silver colloidal particles: role of subphase pH on degree of cluster incorporation, *J. Phys. Chem. B*, 101:4954-8 (1997).

Schmid et al., Siloxane polymers for high-resolution, high-accuracy soft lithography, *Macromolecules*, 33:3042-9 (2000).

Sheen et al., A new class of organized self-assembled monolayers: Alkane thiols on GaAs (100), *J. Am. Chem. Soc.*, 114:1514-5 (1992).

Slavov et al., Mechanism of silation of silica with hexamethyldisilazane, *J. Phys. Chem. B*, 104:983-9 (2000).

Solomun et al., On the promoting effect of alkali metals on the adsorption of nitriles on the gold(100) surface, *Ber. Bunsen-Ges. Phys. Chem.*, 95:95-8 (1991).

Solomun et al., The interaction of nitriles with a potassium-promoted gold(100) surface, *J. Phys. Chem.*, 95:10041-9 (1991).

Son et al., Adsorption of 4-methoxybenzyl cyanide on silver and gold surfaces investigated by fourier transform infrared spectroscopy, *J. Phys. Chem.*, 98:8488-93 (1994).

Song, Quenching of porous silicon photoluminescence by aromatic molecules, and surface derivatization of porous silicon with dimethyl sulfoxide, aryllithium, or alkyllithium reagents, Doctor of Philosophy in Chemistry Thesis, University of California at San Diego (1998).

Soriaga et al., "Determination of the orientation of aromatic molecules adsorbed on platinum electrodes. The effect of solute concentration", *J Am Chem Soc*, 104:3937-45 (1982).

Steiner et al., Adsorption of alkanenitriles and alkanedinitriles on gold and copper, *Langmuir*, 8, 2771-7 (1992).

Steiner et al., Adsorption of $NPh_3$, $PPh_3$, $AsPh_3$, $SbPh_3$, and $BiPh_3$ on gold and copper, *Langmuir*, 8, 90-4 (1992).

Tao, Structural comparison of self-assembled monolayers of n-alkanoic acids on the surfaces of silver, copper, and aluminum, *J. Am. Chem. Soc.*, 115:4350-8 (1993).

Timmons et al., Investigation of fatty acid monolayers on metals by contact potential measurements, *J Phys Chem*, 69:984-90 (1965).

Ulman, *An Introduction to Ultrathin Organic Films: From Langmuir-Blodgett to Self-Assembly*, Boston: Academic Press (1991).

Ulman, Formation and structure of self-assembled monolayers, *Chem. Rev.*, 96:1533-54 (1996).

Walczak et al., Structure and interfacial properties of spontaneously adsorbed n-alkanethiolate monolayers on evaporated silver surfaces, *J. Am. Chem. Soc.*, 113:2370-8 (1991).

Wang et al., Scanning probe contact printing, *Langmuir*, 19:8951-5 (2003).

Wasserman et al., "Structure and reactivity of alkylsiloxane monolayers formed by reaction of alkyltrichlorosilanes on silicon substrates", *Langmuir*, 5:1074-1087 (1989).

Whitesides, Proceedings of the Robert A. Welch Foundation 39th Conference on Chemical Research Nanophase Chemistry, Houston, Texas, pp. 109-21 (1995).

Xia et al., Soft lithography, *Angew. Chem. Int. Ed.*, 37:550-75 (1998).

Xu et al., Surface coordination chemistry of $YBa_2Cu_3O_{7-\delta}$, *Langmuir* 14:6505-11 (1998).

Yonezawa et al., Layered nanocomposite of close-packed gold nanoparticles and $TiO2$ gel layers, *Chem. Mater.*, 11:33-5 (1999).

Zhang et al., Dip pen nanolithography stamp tip, *Nano Lett*, 4:1649-55 (2004).

* cited by examiner

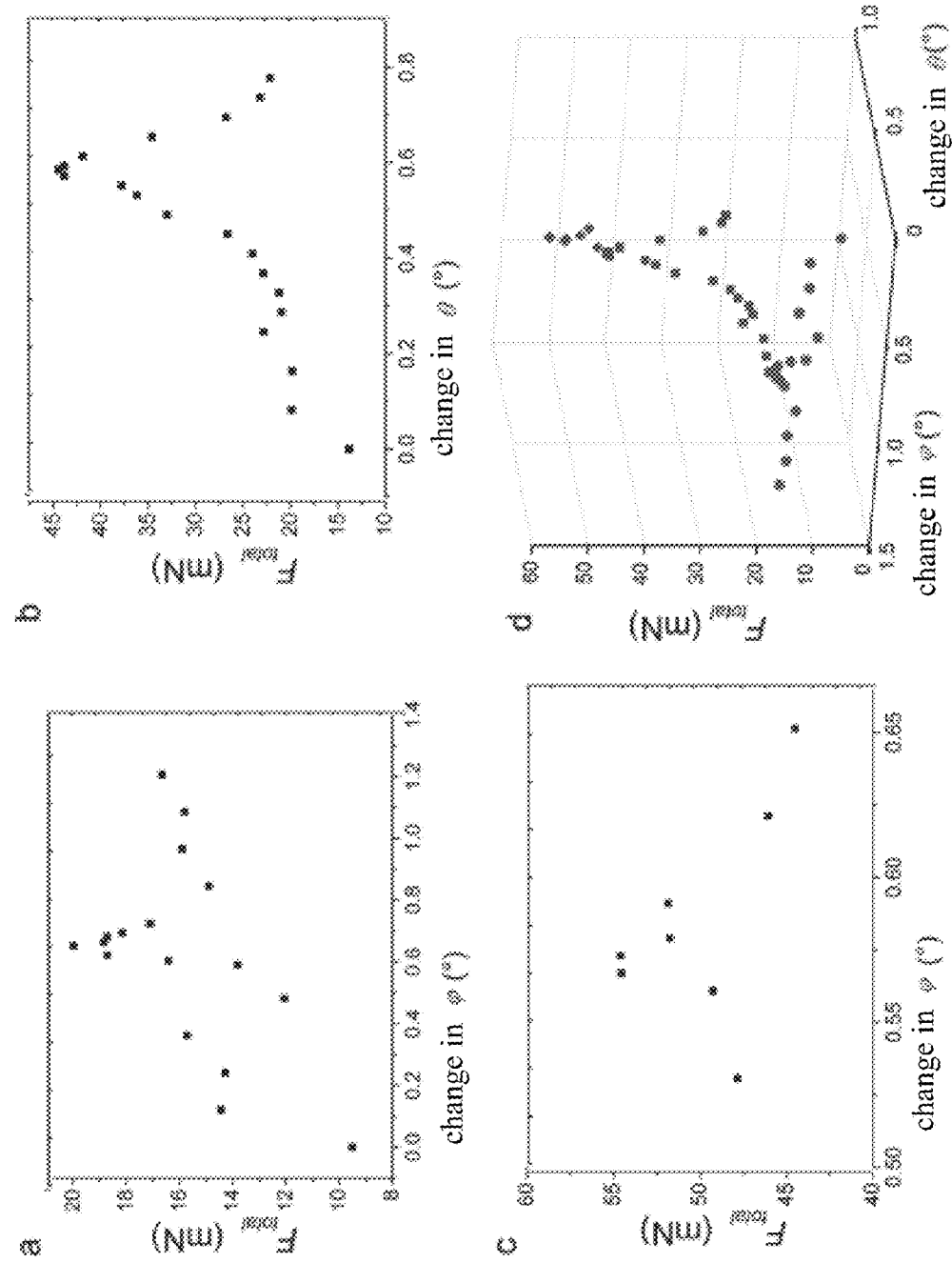
FIGURE 4a-d

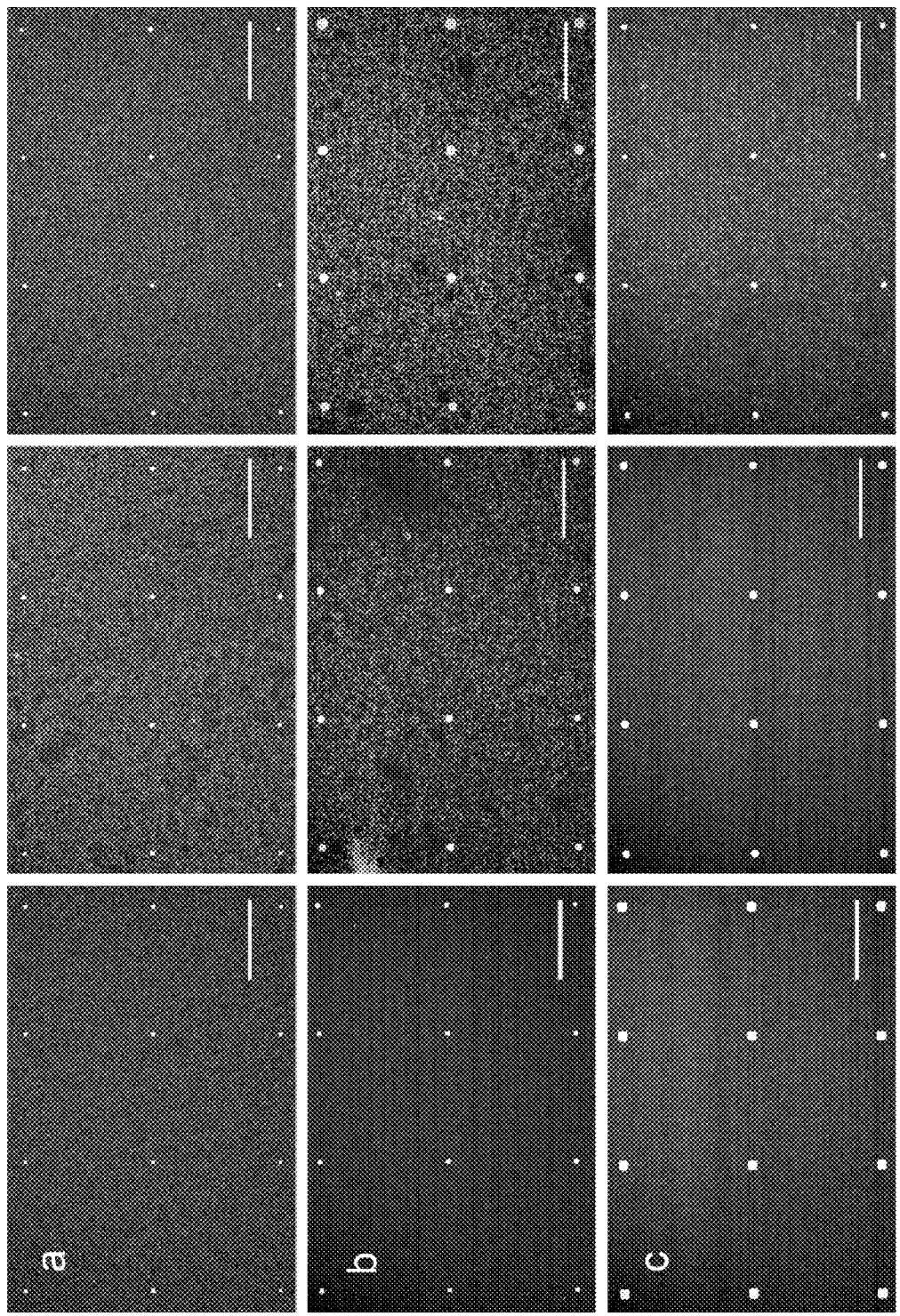
FIGURE 5a-c

FORCE FEEDBACK LEVELING OF TIP ARRAYS FOR NANOLITHOGRAPHY

CROSS REFERENCE TO RELATED APPLICATIONS

The benefit under 35 U.S.C. §119(e) of U.S. Provisional Patent Application Nos. 61/267,382 filed Dec. 7, 2009, and 61/292,444 filed Jan. 5, 2010, is hereby claimed, and their entire disclosures are incorporated herein by reference.

STATEMENT OF GOVERNMENT INTEREST

This invention was made with government support under grant number N66001-08-1-2044 awarded by the Department of Defense (DARPA) and under grant number EEC-0647560 awarded by the National Science Foundation (NSEC). The government has certain rights in the invention.

BACKGROUND

1. Field of the Invention

The invention is generally directed to a method of leveling a pen array, and more particularly to a method of leveling a pen array using a force generated between the pen array and a surface being contacted by the pen array.

2. Brief Description of Related Technology

Polymer pen lithography (PPL) is a molecular printing method that combines the advantages of microcontact printing and dip-pen nanolithography to create arbitrary patterns of molecules on surfaces. PPL differs from microcontact printing in several respects that enable PPL's unique writing capabilities. For example, PPL is a scanning probe printing technique capable of producing arbitrary patterns rather than replicas of the mold into which the stamp (of microcontact printing) is poured. As a result of the piezo-controlled movement of the polymer pen array in the x and y directions, PPL can achieve nanometer scale registration between different features, whereas the mechanical properties of the stamps limit the separation of features and feature sizes that can be produced by microcontact printing. In PPL, features with edge lengths ranging from 80 nm to over 10 µm can be patterned by the same pen by simply varying the dwell time of the tip on the surface or the force with which the pen is pressed onto the surface. There are major challenges in transitioning a contact printing tool based upon pyramidal arrays from the micro- or macroscale to the nanoscale, including tip-substrate alignment, ink diffusion control, lateral control over feature spacing, and feature size control. Some of these challenges have been overcome by PPL, in which these tip arrays are attached to piezo-electric actuators in the context of PPL.

Currently, PPL can be used to print a digitized pattern with sub-100 nm control over feature diameter and position. Because the elastomeric pens are not damaged during writing, a pen array can be reused repeatedly, and the material cost for preparing a pen array is less than one dollar. PPL has been utilized to fabricate circuit patterns, print multiplexed nanoarrays, and deposit nanomaterials over $cm^2$ areas with nanometer scale registration and position control. While PPL maintains time-dependent ink transport, much of the utility of PPL arises from its unique force-dependent ink transfer mechanism. As force is applied to the pyramidal elastomeric tips, they deform and the contact area between the tips and the surface increases, thereby producing larger features.

A challenge that remains for PPL is finding a method to obtain precise leveling between the tip array and the substrate surface. When a tilting between these two planes exists, pens across the array will not contact the surface simultaneously, thereby producing patterns with different feature dimensions across the surface, especially when a pen array having a large number of pens is used. The inability to produce uniform features of large arrays limits the applicability of PPL to patterning small areas rather than full wafers.

Currently, the plane of the PPL tip array and the substrate surface are leveled by bringing the tips into contact with the surface and observing by optical microscopy the deformation of the tips. The motors holding the pen array are subsequently adjusted until all tips appear to undergo an equivalent deformation upon contact with the surface. However, this optical method of leveling is not ideal, and features produced by widely separated pens have different edge lengths because of misalignment not identified by optical leveling that is amplified over large distances. In general, the best optical leveling techniques cannot resolve less than a 0.02° difference in angle between the planes defined by the tip array and the substrate, respectively. This imprecision results in significant variations in feature edge length. For example, for an array of features with an average edge length of 3.83 µm, the outermost features, which are separated by 1 cm, exhibit an edge length difference of 1.73 µm. Additionally, optical leveling requires the use of transmitted light, which limits the array architecture and the materials that can be used to fabricate the pen arrays.

SUMMARY OF THE INVENTION

In accordance with an embodiment of the disclosure, a method of leveling a pen array includes (a) contacting a pen array with a surface and measuring a total force exerted on the surface by the pen array, wherein the surface has first and second axes, the first and second axes being parallel to the surface and perpendicular to one another. The pen array comprises a plurality of tips fixed to a common substrate layer, the tips and the common substrate layer being formed from an elastomeric polymer or elastomeric gel polymer, and the tips having a radius of curvature of less than about 1 µm, and the pen array is disposed at a first angle with respect to the first axis of the surface and a second angle with respect to the second axis of the surface. The method can further include (b) tilting one or both of the pen array and the surface to vary the first and second angles of the pen array with respect to the surface, (c) measuring the total force exerted by the tilted pen array of step (b) on the surface, and (d) repeating steps (b) and (c) until a global maximum of the total force exerted on the surface by the pen array is measured, thereby determining first and second angles which correspond to a leveled position of the pen array with respect to the surface.

In accordance with another embodiment of the disclosure, a method of leveling a polymer pen array includes (a) contacting the tips of a pen array with a surface and measuring a total force exerted on the surface by the pen array, wherein the surface has first and second axes, the first and second axes being parallel to the surface and perpendicular to one another. The pen array comprises a plurality of tips fixed to a common substrate layer, the tips and the common substrate layer being formed from an elastomeric polymer or elastomeric gel polymer, and the tips having a radius of curvature of less than about 1 µm. The pen array disposed at a first angle with respect to the first axis of the surface and a second angle with respect to the second axis of the surface. The method further includes (b) tilting one or both of the pen array and the surface to vary the first angle of the pen array by a first angle tilt increment while holding the second angle of the pen array constant and measuring the total force exerted by the pen array on the surface, (c) repeating step (b) until a first local maximum of the total force exerted on the surface by the pen array is measured, thereby determining an optimized first angle of the pen array, (d) tilting one or both of the pen array and the surface to vary the second angle of the pen array by a second angle tilt increment while holding the first angle of the pen array constant at the optimized first angle and measuring the total force exerted by the pen array on the surface, and (e) repeating step (d) until a second local maximum of the total force exerted on the surface by the pen array is measured, thereby determining an optimized second angle of the pen array. The method can further include (f) tilting one or both of the pen array and the surface to vary the optimized first angle of the pen array by an optimized first angle tilt increment while holding the second angle of the pen array constant at the optimized second angle and measuring the total force exerted by the pen array on the surface, and (g) repeating step (f) until a global maximum of the total force exerted on the surface by the pen array is measured, thereby determining a leveled position of the pen array.

In accordance with an embodiment of the disclosure a method of forming a pattern comprising pattern elements on a substrate surface includes choosing a pattern element size, coating a tip array with a patterning composition, choosing, based on a theoretical model, a contacting pressure for contacting the coated tip array with the substrate to achieve the chosen pattern element size; and contacting the substrate surface at the chosen contacting pressure with the coated tip array to deposit the patterning composition on the substrate and form the pattern having pattern elements with the chosen pattern element size. The tip array includes a compressible elastomeric polymer comprising a plurality of non-cantilevered tips each having a radius of curvature of less than about 1 μm.

In accordance with another embodiment, a method of leveling a cantilevered pen array, includes (a) contacting a cantilevered pen array with a surface and measuring a total force exerted on the surface by the cantilevered pen array, wherein the surface has first and second axes, the first and second axes being parallel to the surface and perpendicular to one another. The cantilevered pen array comprises a plurality of cantilevers supported by a common support structure, and the cantilevered pen array is disposed at a first angle with respect to the first axis of the surface and a second angle with respect to the second axis of the surface. The method can further include (b) tilting one or both of the cantilevered pen array and the surface to vary the first and second angles of the cantilevered pen array with respect to the surface, (c) measuring the total force exerted by the tilted cantilevered pen array of step (b) on the surface, and (d) repeating steps (b) and (c) until a global maximum of the total force exerted on the surface by the cantilevered pen array is measured, thereby determining first and second angles which correspond to a leveled position of the cantilevered pen array with respect to the surface.

BRIEF DESCRIPTION OF THE DRAWINGS

FIGS. 4a-4c are graphs illustrating a leveling method in accordance with an embodiment of the disclosure, and specifically FIG. 4a is a graph illustrating the total force measurements resulting from tilting the polymer pen array to vary φ, while holding θ constant, until a local maximum in total force is found; FIG. 4b is a graph illustrating the total force measurements resulting from tilting the polymer pen array to vary θ, while holding φ constant, until a local maximum in total force is found; and FIG. 4c is a graph illustrating the total force measurements resulting from tilting of the polymer pen array to vary φ, while again holding θ constant until a global maximum in total force is found;

FIG. 4d is a three-dimensional plot constructed from the graphs of FIG. 4a-4c, illustrating that the experimentally determined relationship between the force measured by a force sensor beneath a substrate as a function of θ and φ agrees with the theoretically predicted curve of FIG. 3;

FIG. 5a is scanning electron microscopy images of patterns made by a 10,000 polymer pen array with (θ, φ)=(0, 0), with the scale bar being 50 μm;

FIG. 5b is scanning electron microscopy images of patterns made by a 10,000 polymer pen array with (θ, φ)=(0.01, 0), with the scale bar being 50 μm;

FIG. 5c is scanning electron microscopy images of patterns made by a 10,000 polymer pen array with (θ, φ)=(−0.01, 0), with the scale bar being 50 μm;

DETAILED DESCRIPTION

Figures 1A, 1B:
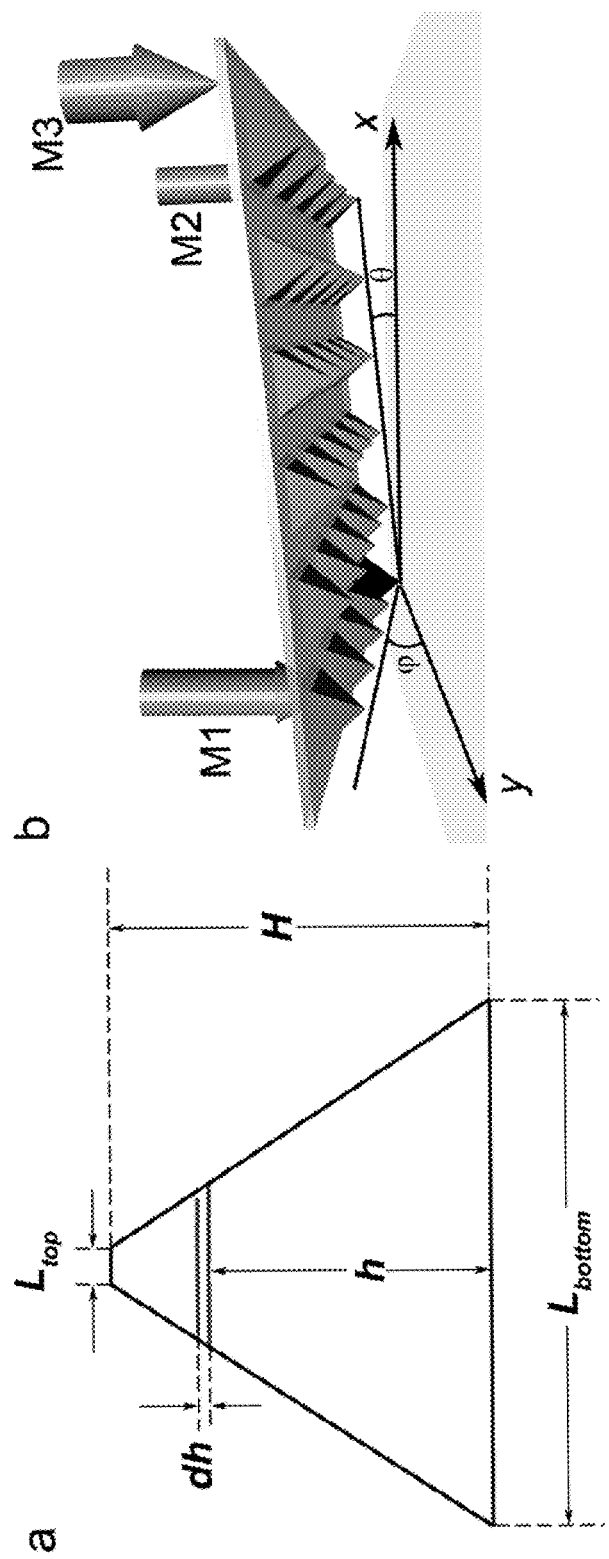
FIG. 1a is a schematic drawing of a pyramidal pen of a polymer pen array.
FIG. 1b is a schematic drawing illustrating an unleveled polymer pen array with arbitrary angles θ and φ between the polymer pen array and the surface, the black pen illustrating the initial point of contact.
Figure 1C:
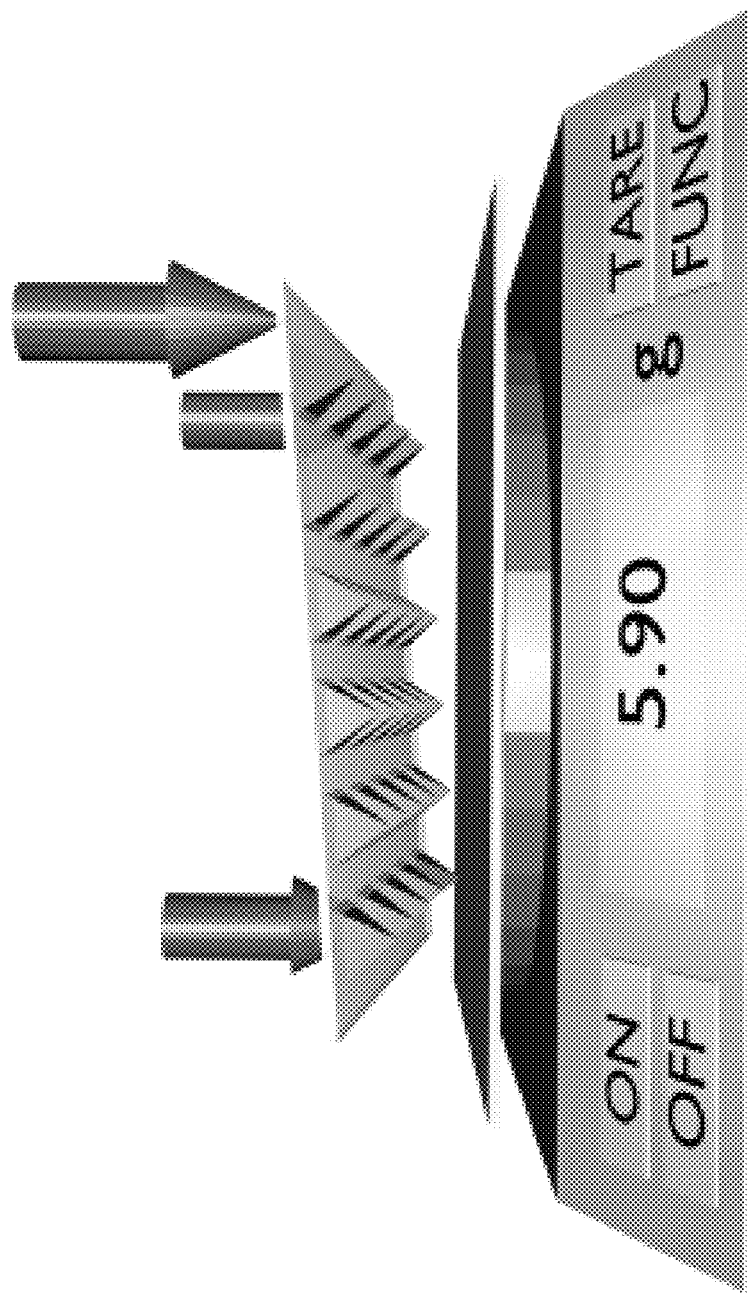
FIG. 1c is a schematic drawing illustrating a polymer pen array contacting a surface on a force sensor in accordance with an embodiment of the disclosure.

Disclosed herein is a method of leveling a pen array that includes adjustment of the angular disposition of a pen array based on the force between the pen array and a substrate surface to achieve leveling of the pen array. Advantageously, the pen array can be leveled with a tilt of less than $1.6 \times 10^{-4}$ degrees when measuring the force exerted by the pen array on the surface with a force sensor having a sensitivity of 0.1 mN. More accurate leveling may be achieved when using a force sensor having increased sensitivity. Embodiments of the method of leveling of the disclosure can result in a leveled pen array that can print a pattern of features that vary in diameter by only about 50 nm over a distance of 1 cm.

In one embodiment, the method of the disclosure can be used to level any pen array for any polymer pen lithography method. For example, the method of the disclosure can be used to level a pen array for polymer pen lithography (PPL), gel pen lithography (GPL), and beam pen lithography (BPL). For a description of Polymer Pen Lithography see International Patent Publication No. WO 2009/132321, the entire disclosure of which is incorporated herein by reference. For a description of Gel Pen Lithography see International Patent Application No. PCT/US2010/024631, the entire disclosure of which is incorporated herein by reference. For a description of Beam Pen Lithography see International Patent Application No. PCT/US2010/024633, the entire disclosure of which is incorporate herein by reference.

A defining characteristic of polymer pen lithography and gel pen lithography, in contrast with DPN and most contact printing strategies, which are typically viewed as pressure or force-independent, is that it exhibits both time- and pressure-dependent ink transport. As with DPN, features made by polymer pen lithography and gel pen lithography can exhibit a size that is linearly dependent on the square root of the tip-substrate contact time. This property of polymer pen lithography and gel pen lithography, which is a result of the diffusive characteristics of the ink and the small size of the delivery tips, allows one to pattern sub-micron features with high precision and reproducibility (variation of feature size is less than 10% under the same experimental conditions). The pressure dependence of polymer pen lithography and gel pen lithography derives from the deformable or compressible nature of the elastomer or gel pen array. Indeed, the microscopic, preferably pyramidal, tips can be made to deform with successively increasing amounts of applied pressure, which can be controlled by simply extending the piezo in the vertical direction (z-piezo). Although such deformation has been regarded as a major drawback in contact printing (it can result in "roof" collapse and limit feature size resolution), with polymer pen lithography and gel pen lithography, the controlled deformation can be used as an adjustable variable, allowing one to control tip-substrate contact area and resulting feature size. Within a pressure range allowed by z-piezo extension of about 5 to about 25 µm, one can observe a near linear relationship between piezo extension and feature size at a fixed contact time. When the z-piezo extends 1 µm or more, the tips exhibit a significant and controllable deformation.

Beam Pen Lithography (BPL) can allow for patterning of sub-micron features over large areas with flexible pattern design, convenient, selective pen tip addressability, and low fabrication cost. As compared to conventional photolithography or contact printing in which only pre-formed patterns (i.e. photomasks) can be duplicated, BPL can provide the flexibility to create different patterns by controlling the movement of a polymer pen array over the substrate and/or by selectively illuminating one or more of the tips in the polymer pen array. Thus, multiple "dots", for example, can be fabricated to achieve arbitrary features. This approach bypasses the need for, and costs associated with, photomask fabrication in conventional photolithography, allowing one to arbitrarily make many different types of structures without the hurdle of designing a new master via a throughput-impeded serial process. An embodiment of BPL generally includes contacting a photosensitive substrate, for example, a substrate having a photosensitive layer coated thereon, with a polymer pen array and irradiating a surface of a polymer pen array with a radiation source, such as, for example, UV light. The polymer pen array generally includes tips having a blocking layer disposed on the sidewalls of the tips and an aperture formed therein exposing the tip end. As a result of the blocking layer blocking the radiation (e.g., by reflection), the radiation is transmitted through the transparent polymer and out the portion of the transparent polymer exposed by the aperture (i.e., the tip end). Patterning using the transmitted radiation can be performed in a contact mode, in which the polymer pen array is brought into contact with the substrate surface, or in a non-contact mode, in which the polymer pen array is brought near the substrate surface, or in a combination thereof in which a subset of one or more pens in the polymer pen array is brought into contact with the substrate surface. In principle, the type of radiation used with the Beam Pen Lithography is not limited. Radiation in the wavelength range of about 300 nm to about 600 nm is preferred, optionally 380 nm to 420 nm, for example about 365 nm, about 400 nm, or about 436 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm.

The photosensitive layer disposed on the substrate can be exposed by the radiation transmitted through the polymer tip for any suitable time, for example, in a range of about 1 second to about 1 minute. For example, the minimum exposure time can be about 1, 2, 3, 4, 5, 6, 7, 8, 9, 10, 20, 30, 40, 50, or 60 seconds. For example, the maximum exposure time can be about 1, 2, 3, 4, 5, 6, 7, 8, 9, 10, 20, 30, 40, 50, or 60 seconds.

The photosensitive layer can be developed, for example, by any suitable process known in the art. For example, when a resist layer is used, the exposed resist layer can be developed for about 30 seconds in MF319 (Rohm & Haas Electronic Materials LLC). The resist layer can be a positive resist or a negative resist. If a positive resist layer is used, developing of the resist layer removes the exposed portion of the resist layer. If a negative resist layer is used, developing of the resist layer removes the unexposed portion of the resist layer. Optionally, Beam Pen Lithography can further include depositing a patterning layer on the substrate surface after exposure followed by lift off of the resist layer to thereby form the patterning layer into the indicia printed on the resist layer by BPL. The patterning layer can be a metal, for example, and can be deposited, for example, by thermal evaporation. The resist lift off can be performed using, for example, acetone.

Figure 2A:
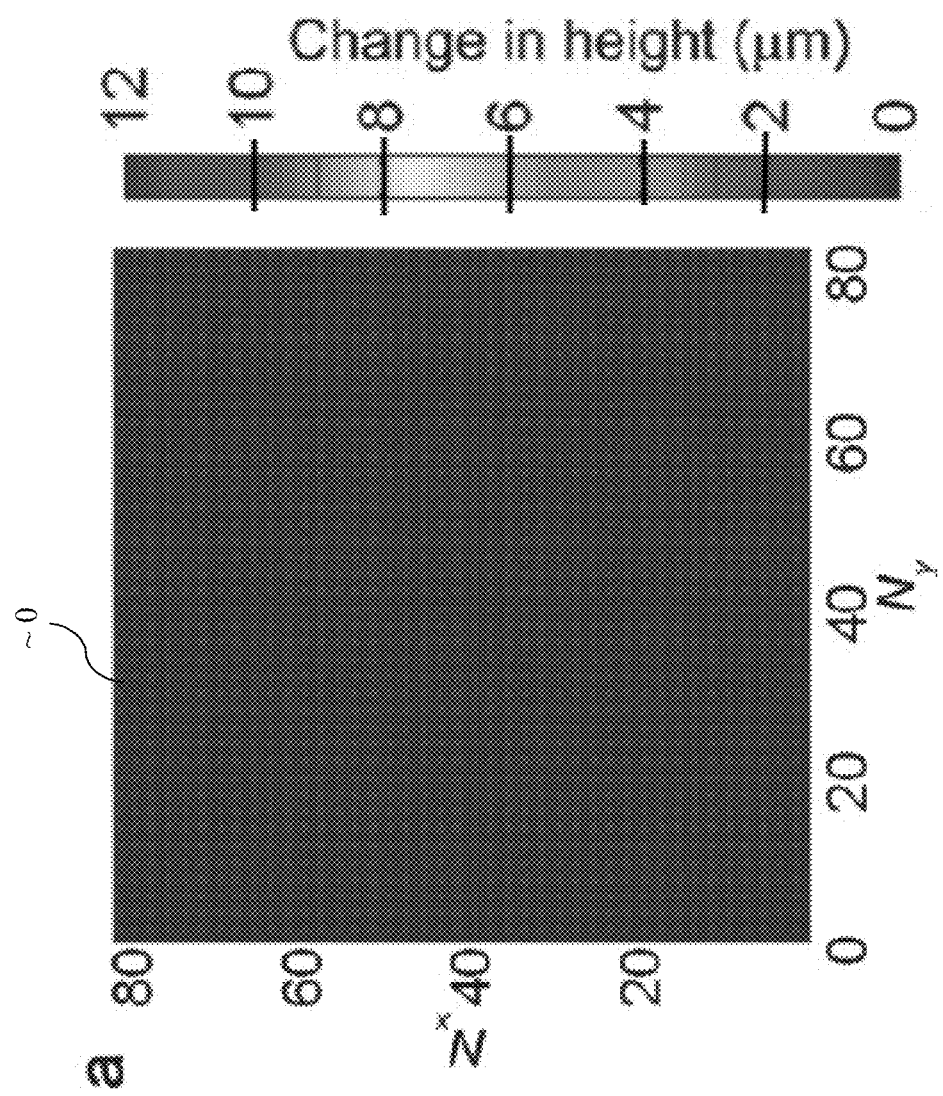
FIG. 2a is a graph illustrating the change in height for each individual pen in the polymer array when (θ, φ)=(0°, 0°)
Figure 2B:
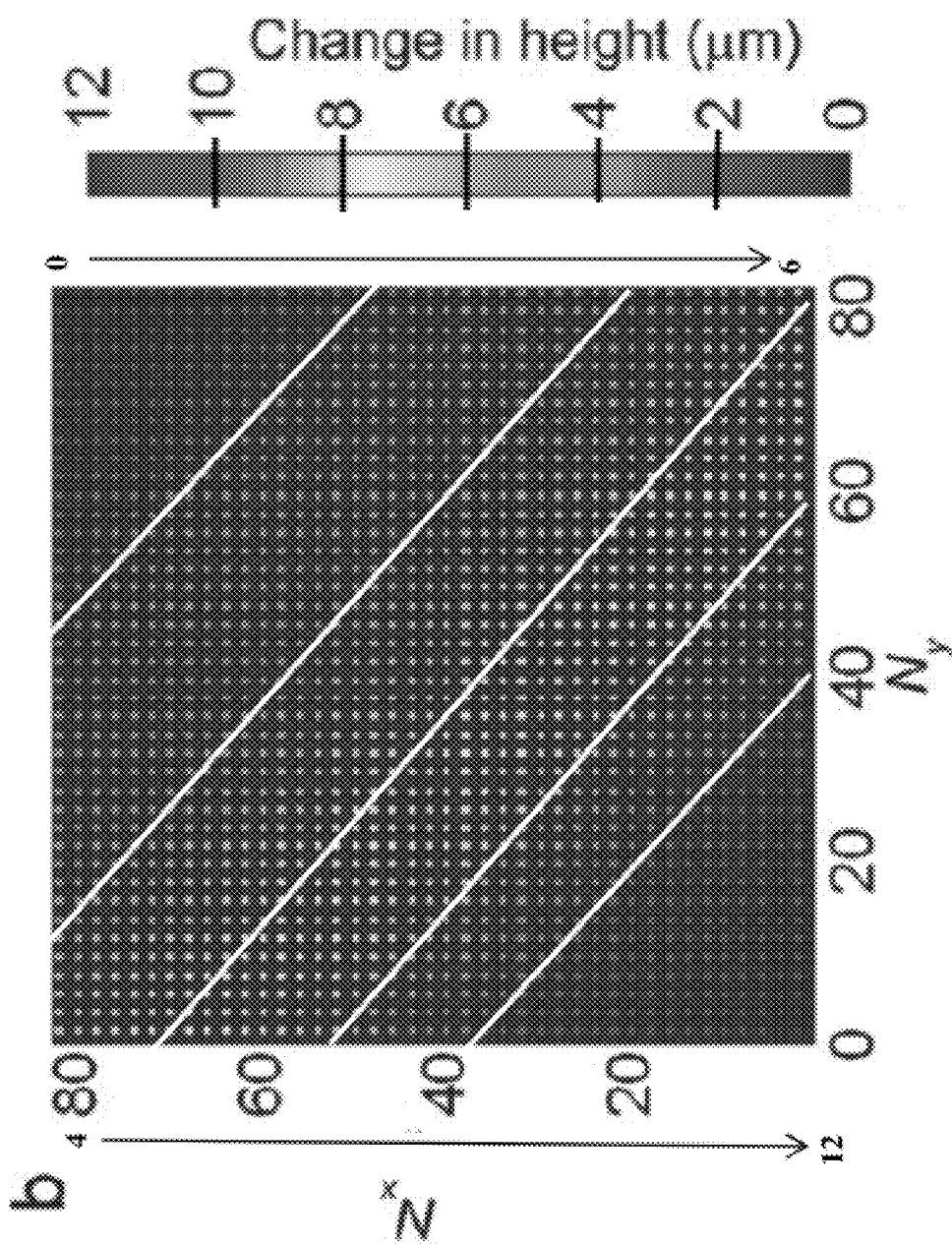
FIG. 2b is a graph illustrating the change in height for each individual pen in the polymer array when (θ, φ)=(0.15°, 0.10°)

Referring to FIG. 2b, the effect of a pen array being unleveled with respect to the surface on the uniformity of the printed features can be significant. For example, for a tilt as small as $\theta=0.15°$ and $\phi=0.1°$, pens only 5 mm away from the first pen to contact the surface (laterally) will not come into contact with the surface, and, therefore, will not write.

In another embodiment, the method of the disclosure can be used to level a cantilevered pen array. The cantilevered pen array includes a plurality of cantilevers supported by a common structure. Each cantilever can include a tip fixed to the cantilever. The tip can be fixed to the cantilever, for example, at or near an end of the cantilever disposed opposite the support structure. For a description of cantilevered pen arrays see, for example, U.S. Patent Publication No. 2009/0205091, the entire disclosure of which is incorporated herein by reference.

As used herein, the term "pen array" refers to both polymer pen arrays and cantilevered pen arrays.

Polymer Pen Arrays

As used herein, the term "polymer pen arrays" generally refers to pen arrays for use in any polymer pen lithography method including, but not limited to, Polymer Pen Lithography, Gel Pen Lithography, and Beam Pen Lithography. Polymer pen arrays generally include elastomeric tips without cantilevers to deliver ink to a printing surface or otherwise pattern a substrate surface (e.g. via transmitted radiation). The tips are preferably made of polydimethylsiloxane (PDMS) or agarose gel. For Beam Pen Lithography, the tips are formed from a material which is at least translucent to the wavelength of radiation intended for use in patterning, e.g., in a range of 300 nm to 600 nm.

A polymer pen array can include any number of tips, preferably having a pyramidal shape, which can be made by molding with a master prepared by conventional photolithography and subsequent wet chemical etching. The tips are also referred to herein as "pens" or "polymer pens." Contemplated numbers of tips include about 1000 tips to about 15 million tips, or greater. The number of tips of the polymer pen array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The tips can be designed to have any shape or spacing between them, as needed. The shape of each tip can be the same or different from other tips of the array. Contemplated tip shapes include spheroid, hemispheroid, toroid, polyhedron, cone, cylinder, and pyramid (trigonal or square). The tips are sharp, so that they are suitable for forming submicron patterns, e.g., less than about 500 nm. For example, the tip ends can have a diameter in a range of about 50 nm to about 1 µm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the maximum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The sharpness of the tip is measured by its radius of curvature, and the radius of curvature of the tips disclosed herein is below 1 and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm. When the sharp tips of the polymer pens are brought in contact with a substrate, ink is delivered at the points of contact.

The tips of the polymer pen array can be designed to have any desired thickness, for example, the thickness of the tip array is about 50 nm to about 50 µm, about 10 µm to about 50 µm, about 50 nm to about 1 µm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. The thickness of the polymer pen array can be decreased as the rigidity of the polymer used to form the tip substrate layer increases. For example, for a gel polymer (e.g., agarose), the tip array can have a thickness in a range of about 10 µm to about 50 µm. For other polymers (e.g., PDMS), for example, the tip array can have a thickness of about 50 nm to about 1 µm. As used herein, the thickness of the tip array refers to the distance from the tip end to the base end of a tip. The tips can be arranged randomly or in any pattern, including a regular periodic pattern (e.g., in columns and rows, in a circular or radial pattern, or the like). The tips have a base portion fixed to the tip substrate layer. The base portion preferably is larger than the tip end portion. The base portion can have an edge length in a range of about 1 µm to about 50 µm, or about 5 µm to about 50 µm. For example, the minimum edge length can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 µm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm. The tip array is preferably formed such that the tip ends lie in a single plane, although alternative arrangements are also contemplated.

The tip-to-tip spacing between adjacent tips (tip pitch) can be in any desired range, including a range of about 1 µm to about over 10 mm, or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

The polymers suitable for use in the polymer pen array can be any polymer having a compressibility and/or deformability compatible with the lithographic methods. In one embodiment, the polymer is deformable; in another embodiment the polymer is compressible. Polymeric materials suitable for use in the polymer pen array can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more, preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir,* 1998, 14-15, 3791-3795. Hydrophobic polymers such as polydimethylsiloxane can be modified either chemically or physically by, for example, exposure to a solution of a strong oxidizer or to an oxygen plasma.

Alternatively, the polymer of the tip array can be a polymer gel. The polymer gel can comprise any suitable gel, including hydrogels and organogels. For example, the polymer gel can be a silicone hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example, gels can be greater than 95% liquid, yet behave like solids due to the presence of a cross-linked network within the liquid. The gel polymer can be, for example, hydrophilic and/or porous, allowing for absorption of a pattern composition.

The polymer of the polymer pen array has a suitable compression modulus and surface hardness to prevent collapse of the polymer during inking and printing, but too high a modulus and too great a surface hardness can lead to a brittle material that cannot adapt and conform to a substrate surface during printing. As disclosed in Schmid, et al., *Macromolecules,* 33:3042 (2000), vinyl and hydrosilane prepolymers can be tailored to provide polymers of different modulus and surface hardness. Thus, in some cases, the polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The polymers of the polymer pen array preferably will have a surface hardness of about 0.2% to about 3.5% of glass, as measured by resistance of a surface to penetration by a hard sphere with a diameter of 1 mm, compared to the resistance of a glass surface (as described in Schmid, et al., *Macromolecules,* 33:3042 (2000) at p 3044). The surface hardness can be about 0.3% to about 3.3%, about 0.4% to about 3.2%, about 0.5% to about 3.0%, or about 0.7% to about 2.7%. The polymers of the tip array can have a compression modulus of about 10 MPa to about 300 MPa. The polymer pen array preferably comprises a compressible polymer or a deformable polymer which is Hookean under pressures of about 10 MPa to about 300 MPa. The linear relationship between pressure exerted on the polymer pen array and the feature size allows for control of the indicia printed using the disclosed methods and polymer pen arrays.

The polymer pen array can comprise a polymer that has adsorption and/or absorption properties for the patterning composition, such that the tip array acts as its own patterning composition reservoir. For example, PDMS is known to adsorb patterning inks, see, e.g., U.S. Patent Publication No. 2004/228962, Zhang, et al., *Nano Lett.* 4, 1649 (2004), and Wang et al., *Langmuir* 19, 8951 (2003).

The tips of the polymer pen array can be fixed to a common substrate. For polymer pen arrays for use with Beam Pen Lithography, the common substrate can be formed of a transparent polymer. The tips can be arranged randomly or in any pattern, including a regular periodic pattern (e.g., in columns and rows, in a circular pattern, or the like). The common substrate can comprise, for example, an elastomeric layer, which can comprise the same polymer that forms the tips of the tip array, or can comprise an elastomeric polymer that is different from that of the tip array. For example, the common substrate can be a gel backing layer. Suitable gels include those described herein in connection with polymer gels for use as tip materials. The elastomeric layer can have a thickness of about 50 μm to about 100 μm. The common substrate layer can have any suitable thickness, for example in a range of about 50 μm to about 5 mm, about 50 μm to about 100 μm, or about 1 mm to about 5 mm. For example, the common substrate layer can have a minimum thickness of about 50, 100, 200, 300, 400, 500, 600, 700, 800, 900, 1000, 2000, 3000, 4000, or 5000 μm. For example, the common substrate layer can have a maximum thickness of about 50, 100, 200, 300, 400, 500, 600, 700, 800, 900, 1000, 2000, 3000, 4000, or 5000 μm. The thickness of the common substrate layer can be decreased as the rigidity of the polymer used to form the common substrate layer increases. For example, for a gel polymer (e.g., agarose), the common substrate layer can have a thickness in a range of about 1 mm to about 5 mm. For other, more rigid, polymers (e.g., PDMS) the common substrate layer can have a thickness in a range of about 50 μm to about 100 μm, for example. The tip array can be affixed or adhered to a rigid support (e.g., glass, such as a glass slide). In various cases, the common substrate, the tip array, and/or the rigid support, if present, is translucent or transparent. In a specific case, each is translucent or transparent. The combined thickness of the tip substrate layer and the tips can be in range of about 50 μm to about 5 mm. The thickness of combination of the tip array and common substrate can be less than about 200 μm, preferably less than about 150 μm, or more preferably about 100 μm.

The common substrate layer is preferably adhered to a rigid support (e.g., a glass, silicon, quartz, ceramic, polymer, or any combination thereof), e.g. prior to or via curing of the polymer. The rigid support is preferably highly rigid and has a highly planar surface upon which to mount the array (e.g., silica glass, quartz, and the like). The rigid support and thin backing layer significantly improve the uniformity of the polymer pen array over large areas, such as a three inch wafer surface, and make possible the leveling and uniform, controlled use of the array. The common substrate layer also can be adapted for coupling to a larger instrument. The coupling is not particularly limited but can be, for example, a mechanical coupling, or a magnetic coupling. A structure adapted for this coupling can be attached to the common substrate layer. For example, a plastic clip adapted with magnetic material can be used.

Polymer pen arrays for use in Beam Pen Lithography generally include a pen array with each tip having a blocking layer disposed thereon, and with an aperture defined in the blocking layer, exposing the transparent tip end (e.g., the photosensitive layer-contacting end of each of the tips). The blocking layer can be coated on the sidewalls of the tips and on portions of the common substrate layer between the tips. The blocking layer serves as a radiation blocking layer, channeling the radiation through the material of the tip and out the exposed tip end. The tips can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips are elastomeric and reversibly deformable, which can allow the tip array to be brought in contact with the substrate without damage to the substrate or the tip array. This contact can ensure the generation of near-field effects.

The blocking layer on the polymer tip sidewalls serves as a radiation blocking layer, allowing the radiation illuminated on a surface of the substrate layer opposite the surface to which the tips are fixed to be emitted only through the tip end exposed by the aperture defined in the blocking layer. The exposure of a substrate pre-coated with a resist layer with the radiation channeled through the tip ends of the tip array can allow for the formation of a single dot per tip for each exposure. The blocking layer can be formed of any material suitable for blocking (e.g., reflecting) a type of radiation used in the lithography process. For example, the blocking layer can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer can have any suitable thickness, for example, in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

As with polymer pen arrays for Polymer Pen Lithography and Gel Pen Lithography, the tips of the polymer pen array for use with BPL can be made by molding with a master prepared by conventional photolithography and subsequent wet chemical etching. Optionally, the tips can be cleaned, for example, using oxygen plasma, prior to coating with the blocking layer. The blocking layer can be disposed on the tips by any suitable process, including coating, for example, spin-coating, the tips with the blocking layer.

An aperture in the blocking layer can be formed by any suitable method, including, for example, focused ion beam (FIB) methods or using a lift-off method. The lift-off method can be a dry lift off method. One suitable approach includes applying an adhesive, such as poly(methyl methacrylate) (PMMA) on top of the blocking layer of the tip array, and removing a portion of the adhesive material disposed at the substrate contacting end of the tips by contacting the polymer pen array to a clean and flat surface, for example a glass surface. The tips can then be immersed in an etching solution to remove the exposed portion of the blocking layer to form the aperture and expose the material of the tip, e.g., the transparent polymer. The remaining adhesive material protects the covered surfaces of the blocking layer from being etched during the etching step. The adhesive can be, for example, PMMA, poly(ethylene glycol) (PEG), polyacrylonitrile, and combinations thereof.

Alternatively, a simple contact approach can be used in which a polymer pen array having the blocking layer is brought in contact with a glass slide or other surface coated with an adhesive material, such as PMMA. Other suitable adhesive materials include, for example, PMMA, PEG, polyacrylonitrile, and combinations thereof. Upon removal of the pen tip from surface coated with the adhesive material, the adhesive material removes the contacted portion of the blocking layer, thereby defining an aperture and exposing the tip material, e.g. the transparent polymer.

In either of the above described aperture forming methods, the size of the aperture formed can be controlled by applying different external forces on the backside of the BPL pen array. As a result of the flexibility of elastomeric tips, the application of force on the backside of the BPL tip array can be used to control the contact area between the tips and adhesive material surface. For example, the BPL pen array can include pyramidal tips, with each pyramid-shaped tip being covered by a gold blocking layer having a small aperture defined in the blocking layer at the very end of the tip. The size of the aperture does not significantly change from tip to tip. For example, the size of the aperture can vary less than about 10% from tip to tip. The size of the aperture can be tailored over the 200 nm to 1 to 10 µm ranges, for example, by controlling contact force. For example, the aperture can have a diameter in a range of about 5 nm to about 5 µm, about 30 nm to about 500 nm, or about 200 nm to about 5 µm. For example, the minimum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. The contact force optionally can be in a range of about 0.002 N to about 0.2 N for a 1 $cm^2$ pen array.

Cantilevered Pen Arrays

Cantilevered pen arrays include a plurality of cantilevers supported by a common support structure. The cantilevered pen array can further include tips fixed to the cantilevers. In one embodiment, each of the cantilevers of the array includes a tip fixed thereto. In another embodiment only a portion of the cantilevers of the array include a tip fixed thereto. The tips can be disposed, for example, at or near an end of the cantilever opposite the end of the cantilever supported by the support structure. In yet another embodiment, the cantilevered pen array is tipless.

The cantilevered pen array can further include silicon ridges and edge standoff spacers, having sufficient heights to help prevent crushing tips against the underside of the silicon handle wafer.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example 100 nm to about 700 nm, or about 250 nm to about 550 nm.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

The cantilevers can be bonded to the support structure, for example, via gold thermocompression bonding. Important factors can be an inherent force independence of the lithographic process based on cantilever tip deposition and use of low k flexible cantilevers including silicon nitride cantilevers.

A support structure can be formed, for example, from a Si wafer using resist layer and bottom side etch with gold deposition. For a description of support structure see, for example, U.S. Patent Publication No. 2008/0105042, the disclosure of which is incorporated herein by reference in its entirety.

The support structure can be fabricated from single crystal silicon. Support structures can also be made, for example, of silicon, pyrex, glass, plastic, soft polymers such as siloxane polymers including polydimethylsiloxane. It may be advantageous to use single crystal silicon to form the support structure to provide for easier and improved control of etching as compared to using pyrex, which can be, for difficult or expensive or provide surface irregularities which interfere with bonding to cantilevers.

The support structure also can be adapted for coupling to a larger instrument. The coupling is not particularly limited but can be, for example, a mechanical coupling, or a magnetic coupling. A structure adapted for this coupling can be attached to the support structure. For example, a plastic clip adapted with magnetic material can be used.

The support structure can comprise base rows for supporting the cantilevers. Base row length is not particularly limited. For example, the base rows can have an average length of at least about 1 mm. Average length for base row can be, for example, about 0.1 mm to about 5 mm, or about 0.5 mm to about 3 mm. In one embodiment, an array can be made, which is about 1 cm by 1 cm and has a base row length of about 10 mm. If base row length becomes too long, one can be limited by bowing of support structure, which can exceed the tip height and can keep all tips from touching the writing surface. Base row length can be adapted for each application to avoid this.

The base rows can have a height with respect to the support of at least about 5 microns. This height is not particularly limited but can be adapted for use with the appropriate cantilever bending. The height of the base row can be at or taller than the tip height minus the stop height to keep from crushing tips with over-travel.

The cantilevers can be supported on the base rows, and the base rows in turn can be supported on a larger support structure for the array. The base rows can extend from the larger support for the array. The array support can be characterized by a surface area which is about two square cm or less, or alternatively about 0.5 square cm to about 1.5 square cm. The size can be adjusted as needed for coupling with an instrument.

One or two dimensional arrays of cantilevers can be used. Two-dimensional array of cantilevers are known in the art. For example, a description of two dimensional arrays of cantilevers see, for example, U.S. Patent Publication No. 2008/0105042, U.S. Patent Publication No. 2008/0309688, the disclosures of which are incorporated herein by reference in their entireties.

The two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated into a larger instrumental device by combining two parts, each part having a surface which is patterned in two dimensions and adapted to be mated with each other in the two dimensions. One part can comprise the support structure, without cantilevers, whereas the other part can comprise the cantilevers.

In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge, or in other cases as one moves from edge to center. One can remove parts which have too high defect density and use remaining parts.

In measuring parameters for the array, average measurements can be used. Average measurements can be obtained by methods known in the art including for example review of representative images or micrographs. The entire array does not need to be measured.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle, for example, of at least 5° from their base, or at least 10° from their base, or at an angle of at least 15° from their base. Methods known in the art can be used to measure this angle. Average value for angle can be used. The cantilevers can be bent on average about 10 microns to about 50 microns, or about 15 microns to about 40 microns. This distance of bending can be measured by methods known in the art. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In some embodiments, the array can be adapted so that the cantilevers are both bent toward the surface and also comprise tips which are longer than normal compared to tips used merely for imaging.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long or tall tips. Factors which can be useful to achieve this result include use of long or tall tips, bending of the cantilever arms, tip leveling, row leveling, and leveling of the cantilevers in all dimensions. One or more combination of factors can be used.

The cantilever tips can be relatively long or tall as known in the art. For example, the tips can have an apex height relative to the cantilever of at least four microns on average, and if desired, the tips can have an apex height relative to the cantilever of at least seven microns on average. In addition, tip apex height can be at least 10 microns, or at least 15 microns, or at least 20 microns. No particular upper limit exists. This long length can help ensure that only tips are contacting the surface. Apex height can be taken as an average of many tip apex heights, and in general, apex height is engineered not to vary substantially from tip to tip. Methods known in the art can be used to measure tip apex height.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be, for example, a solid tip or a hollow tip. For a description of tip geometries for depositing materials on surfaces see, for example, International Patent Publication No. WO 2005/115630. The tips can be made, for example, with polymers including soft polymers like siloxane polymer.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 10,000 per square inch, or at least 40,000 per square inch, or at least 70,000 per square inch, or at least 100,000 per square inch, or at least 250,000 per square inch, or at least 340,000 per square inch, or at least 500,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns in one dimension, and about 5 microns to about 35 microns in the second dimension. There is no particular lower limit on tip spacing as fabrication methods will allow denser tip spacing over time. Examples of lower limits include 1 micron, or 5 microns, or 10 microns so for example tip spacing can be one micron to 300 microns, or one micron to 100 micron.

The tips can be engineered to have consistent spacing for touching the surface consistently. For example, each of the tips can be characterized by a distance d spanning the tip end to the support, and the tip array is characterized by an average distance d' of the tip end to the support, and for at least 90% of the tips, d is within 50 microns of d'. In another embodiment, for at least 90% of the tips, d is within 10 microns of d'. The distance between the tip ends and the support can be for example about 10 microns to about 50 microns. This distance can comprise for example the additive combination of base row height, the distance of bending, and the tip height.

Arrays can be adapted for passive pen or active pen use. Control of each tip can be carried out by, for example, piezoelectric, capacitive, electrostatic, or thermoelectric actuation.

The arrays can be adapted for integration of tip coating and ink delivery. For example, microfluidics can be used to control inking and coating of the tips. Tips can be dipped into devices or ink can be delivered directly through internal regions of the tip for hollow tip embodiments.

Tips can be adapted to have various tip sizes, arrangements, numbers, sharpnesses, densities, and materials.

Model for Leveling of a Polymer Pen Array

FIG. 1a is a schematic drawing of the pyramidal tip illustrating the dimensions of the tip. The pyramidal tip can be formed, for example, of poly(dimethylsiloxane) (PDMS). Assuming perfect leveling, the force F (measured by a force sensor beneath the substrate) is related to the change in height of the polymer pen Z, as shown in Equation 1:

$$F(Z) = \frac{NEL_{bottom}L_{top}}{H}Z, \quad \text{Equation 1}$$

wherein N is the total number of pens in the array, E is the compression modulus of the elastomer used, H is the total height of the pyramidal tip prior to compression, $L_{bottom}$ is the edge length at the bottom surface of the pyramidal tip, and $L_{top}$ is the edge length at the top surface of the pyramidal tip. Under perfect leveling, the change in height Z of the polymer pen is equal to the z-piezo extension $Z_0$.

The compression modulus E of PDMS, for example, depends on the compression ratio, which is described by the Mooney-Rivlin equation. For example, a two stage model of the compression module can be employed such that there exists a threshold value of the z-piezo extension $z_t$, below which $E=E_1$ and above which $E=E_2$. For example, for PDMS, $E_1$ can equal 1.38 MPa and $E_2$ can equal 8.97 MPa. Thus, the force can be determined by Equations 2 and 3 for different values of Z.

$$F = NE_1 L_{bottom} L_{top} \frac{Z}{H}, \quad \text{Equation 2}$$

when $$Z \leq z_t$$

$$F = NE_1 L_{bottom} L_{top} \frac{Z}{H} + NE_2 L_{bottom} L_{top} \frac{Z - z_t}{H}, \quad \text{Equation 3}$$

when $$Z > z_t$$

Referring to FIG. 1b, the tilting between the pen array and the substrate surface can be described by two angles θ and φ, which are related to the x- and y-axes between the plane of the pen array and the plane of the substrate surface. For a polymer pen array having a regular periodic pattern of tips, for example, the x- and y-axes can be disposed parallel to the rows and columns of tips in the regular periodic pattern, respectively. To bring the pen array in contact with or near to the substrate surface, the array and substrate are brought together in the z-axis direction, perpendicular to the x- and y-axes Likewise, to deform or press pens against the surface, the surface and pen array are brought together in the z-axis direction, with increased force applied after initial contact. Under z-piezo extension, the compression of each pen $Z_{pen}$ varies with θ and φ, the z-piezo extension, and the distance of the particular pen from the closest pen to the surface $N_x$ and $N_y$, along the x- and y-axes, respectively. If the compression of the first pen to contact the surface is $Z_0$, the $Z_{pen}$ for any single pen in the array can be calculated using Equation 4:

$$Z_{pen}(N_x, N_y, \theta, \phi) = Z_0 - DN_x \sin(\theta) - DN_y \sin(\phi), \quad \text{Equation 4}$$

wherein D is the spacing between pens in the polymer pen array, and $N_x$ and $N_y$ are the number of pens from the first pen to contact the surface along the x and y axes, respectively.

The force generated by any single pen on the surface can be calculated as a function of Z, θ, φ, $N_x$, and $N_y$ using Equation 5 or 6, depending on the value of Z:

$$F(N_x, N_y, \theta, \varphi) = \qquad \text{Equation 5}$$
$$\frac{E_1 L_{bottom} L_{top}}{H}(Z_0 - DN_x \sin(\theta) - DN_y \sin(\varphi)),$$
$$\text{when } Z \le z_t$$

$$F(N_x, N_y, \theta, \varphi) = \frac{E_1 L_{bottom} L_{top}}{H} z_t + \qquad \text{Equation 6}$$
$$\frac{E_2 L_{bottom} L_{top}}{H}(Z_0 - z_t - DN_x \sin(\theta) - DN_y \sin(\varphi)),$$
$$\text{when } Z > z_t$$

The total force $F_{total}$ generated on the surface by the tilted polymer pen array, with a spacing D between pens, can be calculated as a function of θ and φ as shown in Equation 7:

$$F_{total}(\theta, \varphi) = \sum_{N_x} \sum_{N_y} F(N_x, N_y, \theta, \varphi) \qquad \text{Equation 7}$$

Figure 3:
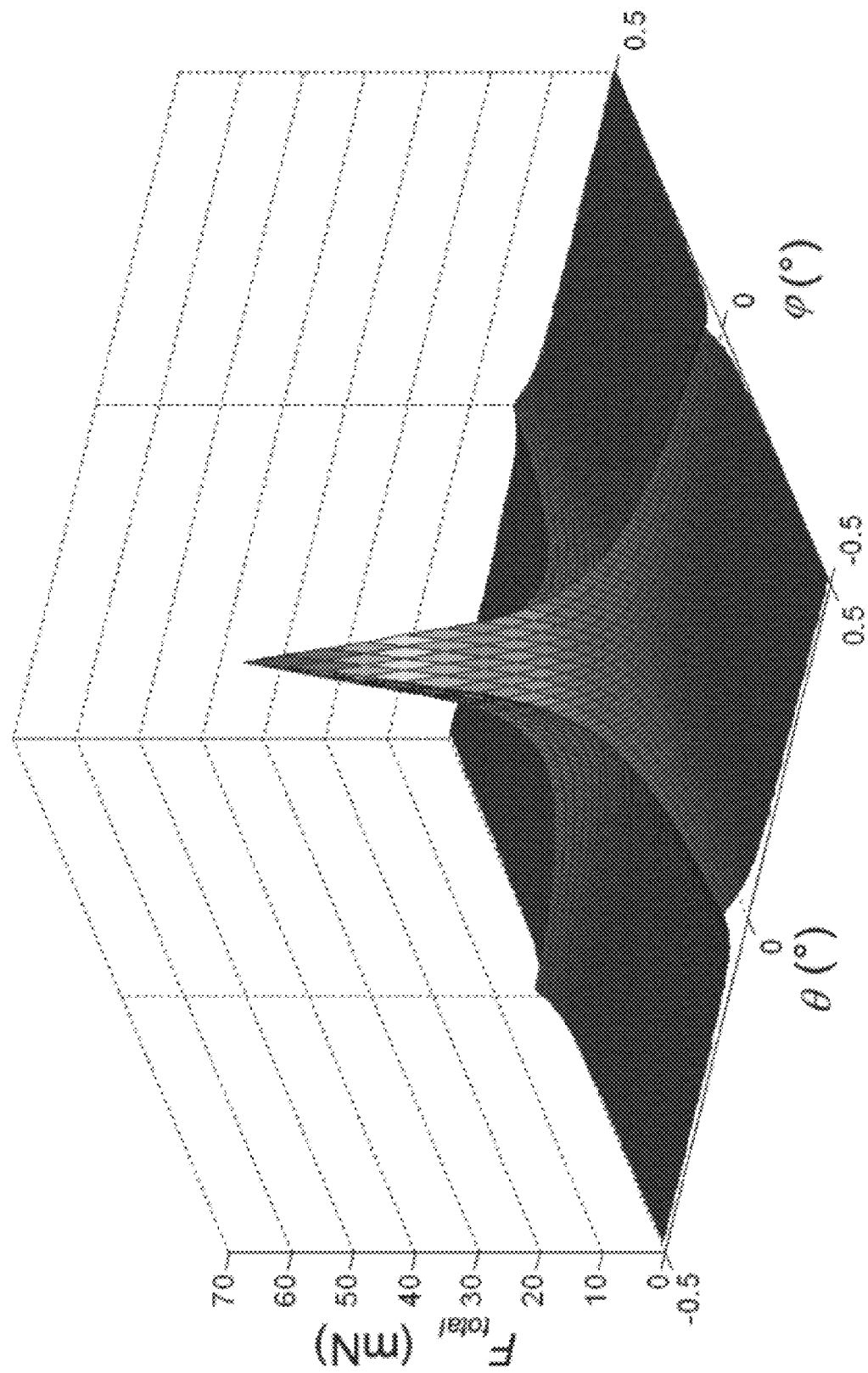
FIG. 3 is a graph illustrating the predicted total force between the polymer pen array and a substrate surface plotted as a function of θ and φ.

As illustrated in FIG. 3, because $F_{total}$ is a function of θ and φ, when these angles are changed, $F_{total}$ between the polymer pen array and the surface also changes for the same z-piezo extension ($Z_0$). FIG. 3 was generated from the foregoing equations using the following polymer pen array parameters: N=10,000 pens, $Z_0$=12 μm, D=80 μm, and $L_{top}$=70 nm. From this relationship it can be concluded that at the perfect leveling position, (θ, φ)=(0, 0), the total force between the tip array and the surface reaches a global maximum. For any given value of θ, $F_{total}$ reaches a local maximum value when φ=0, and vice versa. As θ and φ approach 0, the gradient in force with respect to changes in the angle, $\partial F/\partial \theta$ and $\partial F/\partial \phi$, increases and is not a function of $Z_0$ as shown in Equations 8 and 9:

$$\frac{\partial F_{total}}{\partial \theta} = \sum_{N_x} \sum_{N_y} \frac{\partial F}{\partial \theta} \qquad \text{Equation 8}$$
$$= -\sum_{N_x} \sum_{N_y} \frac{E_1 L_{bottom} L_{top}}{H} DN_x \cos(\theta),$$

when
$$Z \le z_t$$

$$\frac{\partial F_{total}}{\partial \theta} = \sum_{N_x} \sum_{N_y} \frac{\partial F}{\partial \theta}$$
$$= -\sum_{N_x} \sum_{N_y} \frac{E_2 L_{bottom} L_{top}}{H} DN_x \cos(\theta),$$

when
$$Z > z_t$$

$$\frac{\partial F_{total}}{\partial \varphi} = \sum_{N_x} \sum_{N_y} \frac{\partial F}{\partial \varphi} \qquad \text{Equation 9}$$
$$= -\sum_{N_x} \sum_{N_y} \frac{E_1 L_{bottom} L_{top}}{H} DN_y \cos(\varphi),$$

when
$$Z \le z_t$$

$$\frac{\partial F_{total}}{\partial \varphi} = \sum_{N_x} \sum_{N_y} \frac{\partial F}{\partial \varphi}$$
$$= -\sum_{N_x} \sum_{N_y} \frac{E_2 L_{bottom} L_{top}}{H} DN_y \cos(\varphi),$$

when
$$Z > z_t$$

Leveling of a Pen Array

A polymer pen array can be leveled using the above-described model for the relationship between the force exerted on the surface by the pen array and the angle of tilt of the pen array.

Additionally, the recognition of the relationship between force exerted by the pen array on the surface and the angle of tilt of the pen array illustrated in the above-described model can be used to level a cantilevered pen array. When a cantilevered pen array is brought into contact with a substrate surface, the cantilever is bent and a force is generated between the cantilever and the substrate. For example, where the cantilevered array includes tips fixed to the cantilevers, the force can be generated between the tips and the substrate. In one embodiment, the force generated between the cantilever (or tips) and the substrate surface can exhibit a nearly linear relationship with the change in height of each cantilever, with the spring constant of the cantilever being the slope of the line of the linear relationship. When an unleveled cantilevered pen array is brought into contact with the substrate surface, the change in height for each cantilever will vary as a result of the tilting angles between the cantilevered array and the substrate. Thus, much like the relationship described in the above-described model for polymer pen arrays, the force generated by each cantilever is a function of the tilting angle and the distance the cantilever is spaced from the first cantilever to contact the substrate surface.

Such a leveling method can achieve leveling of the pen array within at least about 0.004°, and more preferably within at least about $1.6 \times 10^{-4}$ degrees when a force sensor with a sensitivity of about 0.1 mN is used. More accurate leveling may be achieved with a force sensor having improved sensitivity. In accordance with embodiments of the disclosure, a method of leveling a pen array includes contacting the pen array with a surface and measuring a force exerted on the surface by the pen array. The force can be measured in any suitable way. For example, the force can be measured by placing a force sensor beneath the surface. In another embodiment, the force sensor can be the contacted surface. Preferably, the force sensor has a sensitivity of about 0.1 mN or better. The pen array and/or the surface is then tilted to vary one of the angles, for example, θ by a tilt angle increment while holding the other angle, for example, ϕ constant, and the total force exerted by the pen array on the surface is again measured. This process is repeated until a local maximum of the total force is measured. Referring to FIG. 4a, the measured values of the total force can be plotted as a function of the change in θ to determine when a local maximum of the total force has been measured. The position of the pen array once the local maximum of the total force is measured is the optimized position for θ. The pen array and/or the surface is next tilted to vary the other one of the angles, ϕ, by a tilt angle increment while holding θ at the previously determined optimized position and measuring the total force exerted by the pen array on the surface. This process is repeated until a local maximum of the total force is measured. Referring to FIG. 4b, the measured values of the force can be plotted as a function of the change in ϕ to determine when a local maximum of the total force has been measured. The position of the pen array once the local maximum of the total force is measured is the optimized position for ϕ. The tilt of the pen array can then be finely varied to vary the optimized position of the first varied angle, θ, while holding ϕ at the previously determined optimized position until a global maximum of the total force exerted by the pen array is found. Referring to FIG. 4c, the measured values of the total force can be plotted as a function of the change in θ to determine when a global maximum of the total force has been measured. FIG. 4d is a three-dimensional plot generated from FIG. 4a-4a, illustrating the above-described leveling method. This routine, or suitable equivalent, can be incorporated into a software algorithm to receive force values and control an automated stage for computer-controlled leveling of a pen array.

The angles of the pen array can be adjusted by tilting one or both of the pen array and the surface. For example, the pen array alone can be tilted, the surface alone can be tilted, or both the pen array and the surface can be tilted. The pen array can be titled, for example, by adjusting the motors holding the pen array. For example, referring to FIG. 1b, for a polymer pen array, three extension motors M1, M2, and M3, can hold the pen array. When the two motors M1 and M3 are fixed and the motor M2 is adjusted, the pen array will be tilted in the ϕ-direction. For example, when the two motors M1 and M3 are fixed and the motor M2 is increased by 100 μm, ϕ will increase by about 0.08°. When the two motors M2 and M3 are fixed and the motor M1 is increased by 100 μm, θ will increase about 0.04°. Any other method of adjusting the pen array and/or the surface relative to the pen array can be used. For example, the pen array can be leveled while mounted on an NSCRIPTOR (NanoInk, Inc.) nanolithography platform or on a Park Systems' XE-150 platform (Park Systems). For example, for a cantilevered pen array, motors holding the cantilevered pen array can be adjusted to adjust the angles of the cantilevered pen array.

The tilt angle increment for varying either or both of θ and ϕ can be in a range of about −0.1° to about 0.1°, about $1.6 \times 10^{-4}$ degrees to about 0.1°, about 0.0005° to about 0.05°, about 0.005° to about 0.01°, or about 0.001° to about 0.05°. For example, the minimum tilt angle increment can be about 0.00016, 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, and 0.1°. For example, the maximum tilt angle increment can be about 0.00016, 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, and 0.1°.

Once the pen array is leveled, a substrate can be patterned by coating the pen array with a patterning composition and contacting the coated pen array, while being held in the level position, with the substrate. For a description of patterning using Polymer Pen Lithography see International Patent Publication No. WO 2009/132321, the entire disclosure of which is incorporated herein by reference. For a description of patterning using Gel Pen Lithography see International Patent Application No. PCT/US2010/024631, the entire disclosure of which is incorporated herein by reference. For a description of patterning using Beam Pen Lithography see International Patent Application No. PCT/US2010/024633, the entire disclosure of which is incorporate herein by reference. For a description of patterning using cantilevered pen arrays see, for example, U.S. Pat. No. 6,635,311, the entire disclosure of which is incorporated herein by reference.

Force Dependent Feature Size

Figure 6A:
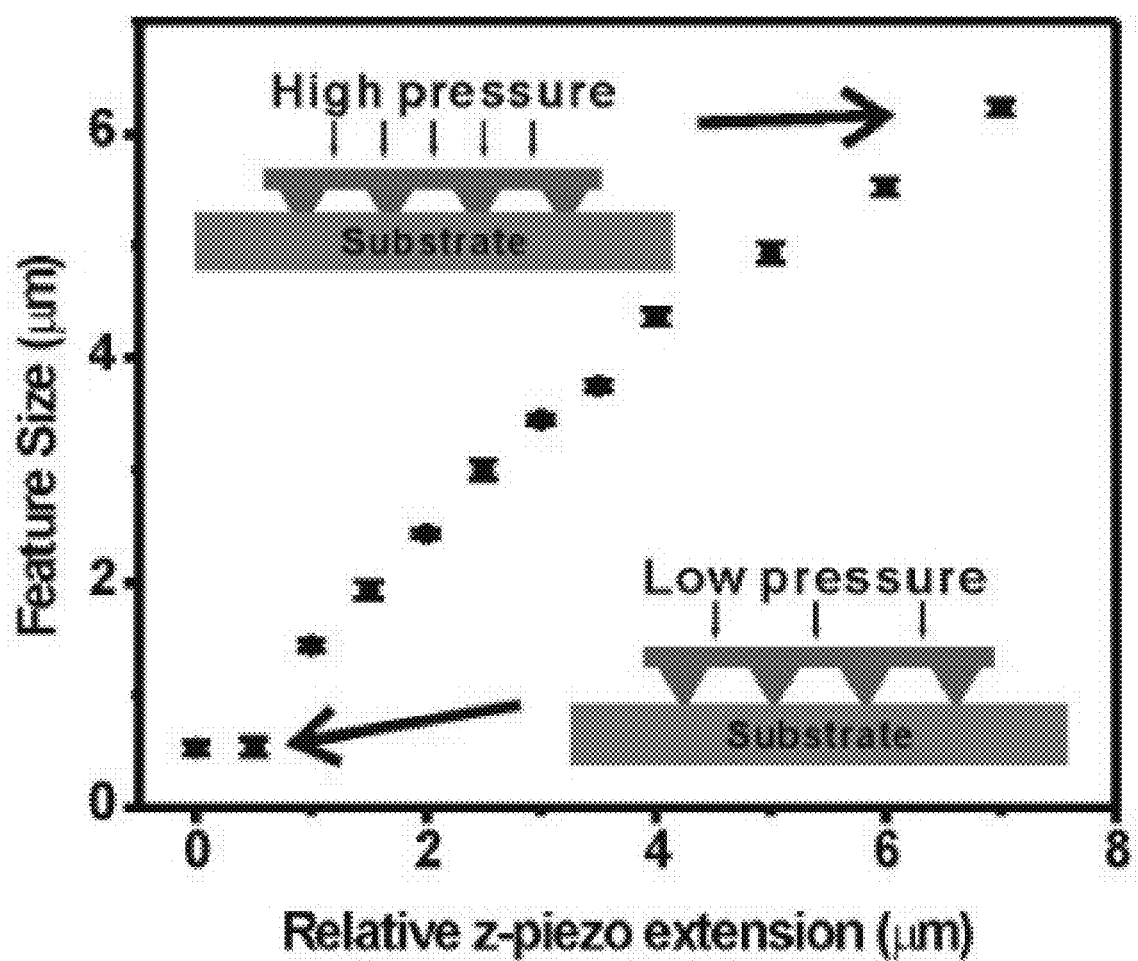
FIG. 6a is a graph illustrating the feature size as a function of the relative z-piezo extension.
Figure 6B:
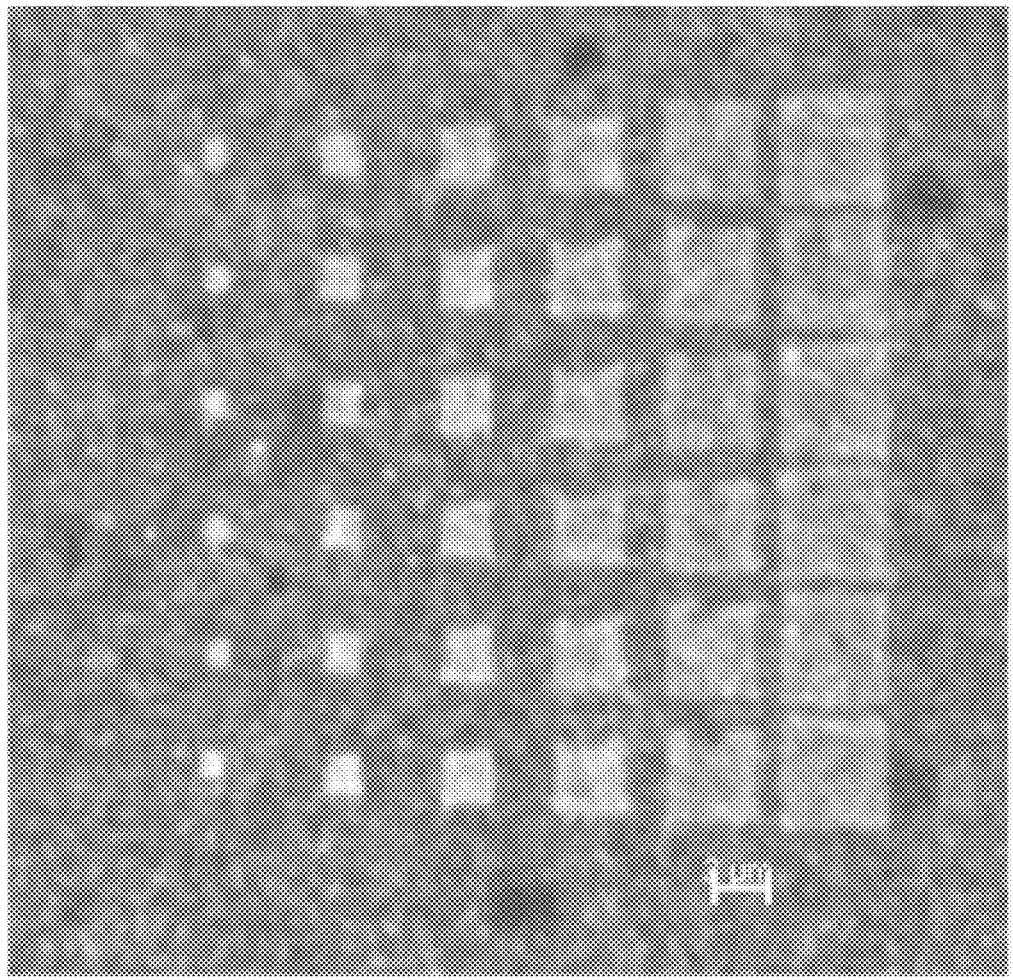
FIG. 6b is a scanning electron microscopy (SEM) image of Au patterns formed by polymer pen array using increasing z-piezo extension from right to left of the figure.
Figure 7:
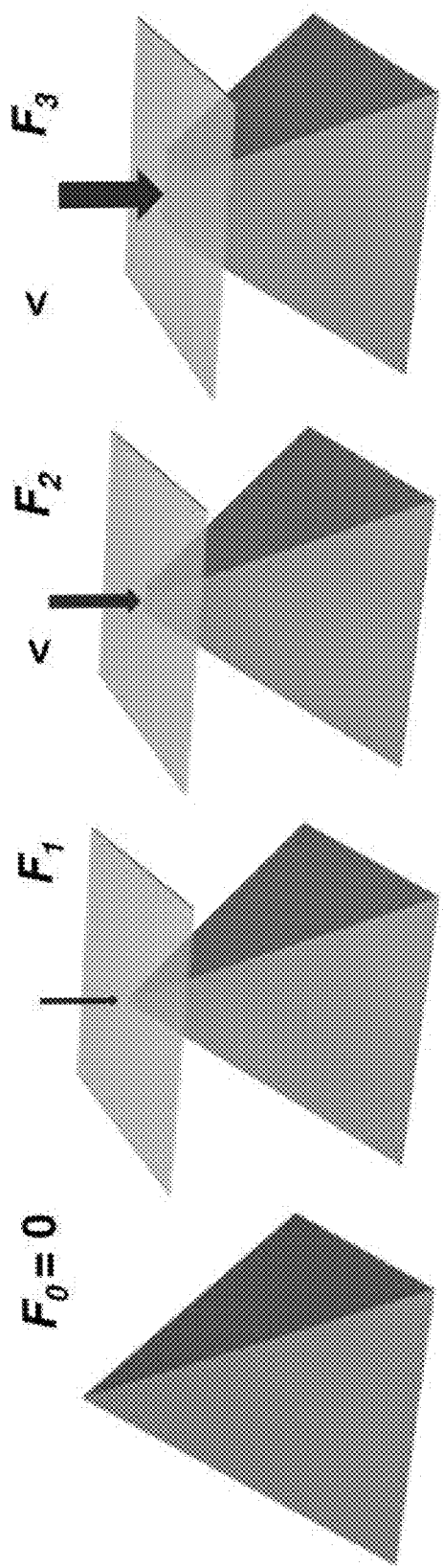
FIG. 7 is a schematic illustration of the deformation of a polymer pen upon exertion of increasing force by the polymer pen on the substrate surface.

A defining characteristic of polymer pen lithography methods, in contrast with DPN and most contact printing strategies, which are typically viewed as pressure or force-independent, is that polymer pen lithography methods exhibit both time- and pressure-dependent ink transport. Referring to FIG. 6a, within the pressure range allowed by z-piezo extension, a nearly linear relationship between piezo extension and feature size can be observed at a fixed contact time of 1 s. For example, when the z-piezo extends 1 μm or more, the tips exhibit a significant and controllable deformation. For example, referring to FIG. 6b, a six by six gold square array, where each square in a row was written with one printing cycle using an MHA ink at different tip-substrate pressures at a constant time tip-substrate contact time of 0.1 s, was fabricated by PPL and subsequent wet chemical etching. The largest and smallest gold squares are 4 μm and 600 nm on edge, respectively. FIG. 7 illustrates the change in the tip of the pens of the polymer pen array upon application of increasing amounts of force.

The force dependence of the features size when printing with polymer pen lithography methods can be predicted using the above-described force model. Specifically, the edge length of the printed feature $L_{feature}$ can be estimated using Equation 10.

$$L_{feature} = L_{top} + \frac{v}{NEL_{top}} F \qquad \text{Equation 10}$$

where $L_{top}$ is the edge length at the top surface of the pyramidal tip, v is Poisson's ratio of the elastomer used to form the pens, N is the total number of pens in the polymer pen array, E is the compression modulus of the elastomer used to form the pens, and F is the force generated by the pen array on the surface. Increased force can be generated by applying a pressure on the pen array in the z-axis direction, perpendicular to the x- and y-axes of the substrate. For example, the Poisson's ratio can be in a range of about 0.3 to about 0.5, about 0.4 to about 0.5, or about 0.3 to about 0.4. Other suitable values Poisson's ratio include, for example, about 0.3, 0.31, 0.32, 0.33, 0.34. 0.35, 0.36, 0.37, 0.38, 0.39, 0.4, 0.41, 0.42, 0.43, 0.44, 0.45, 0.46, 0.47, 0.48, 0.49, and 0.5. For example, when PDMS is used as the elastomeric polymer, the Poisson's ratio is about 0.3.

As described above, a two stage model of the compression modulus can be employed such that there exists a threshold value of the z-piezo extension $z_t$, below which, $E=E_1=1.38$ MPa and above which $E=E_2=8.97$ MPa. Thus, the edge length of the printed feature can be determined by Equations 11 and 12 for different values of Z.

$$L_{feature} = L_{top} + \frac{v}{NE_1 L_{top}} F, \quad \text{Equation 11}$$
when
$$Z \leq z_t$$

$$L_{feature} = \frac{v}{NE_2 L_{top}} F + L_{top} + vL_{bottom} \frac{z_t}{H}\left(1 - \frac{E_1}{E_2}\right), \quad \text{Equation 12}$$
when
$$Z > z_t$$

Figure 8A:
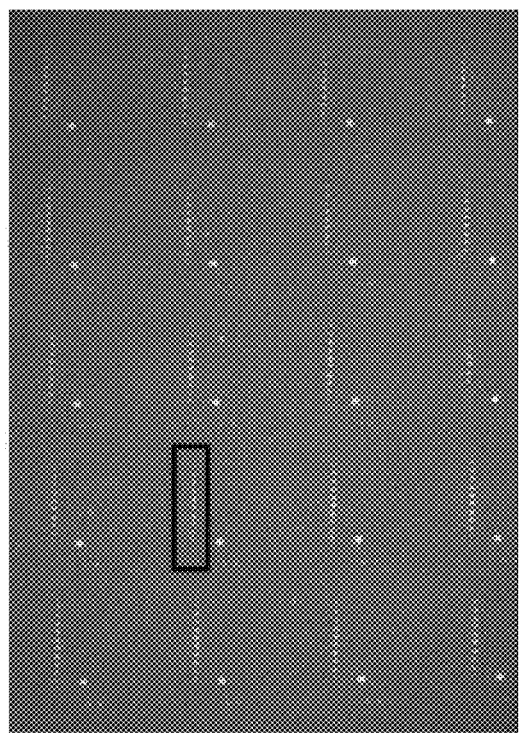
FIG. 8a is a SEM image of Au patterns formed by a polymer pen array using varying force exerted by the polymer pen on the substrate surface.
Figure 8B:
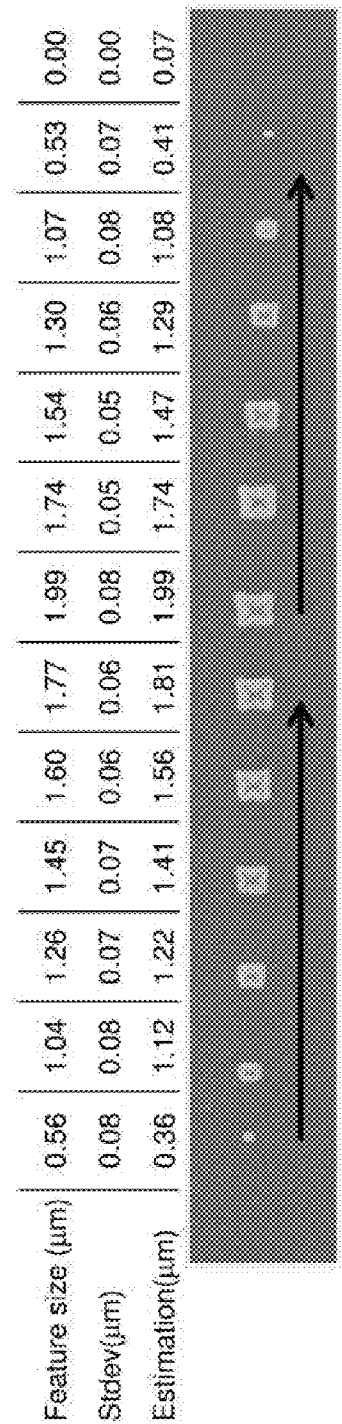
FIG. 8b is an enlarged SEM image of a portion of FIG. 8b illustrating the varying size of the Au pattern. The table above FIG. 8b provides the feature sizes of the features across the patterns of FIG. 8a and the corresponding estimated feature size calculated by a method in accordance with an embodiment of the disclosure.
Figure 8C:
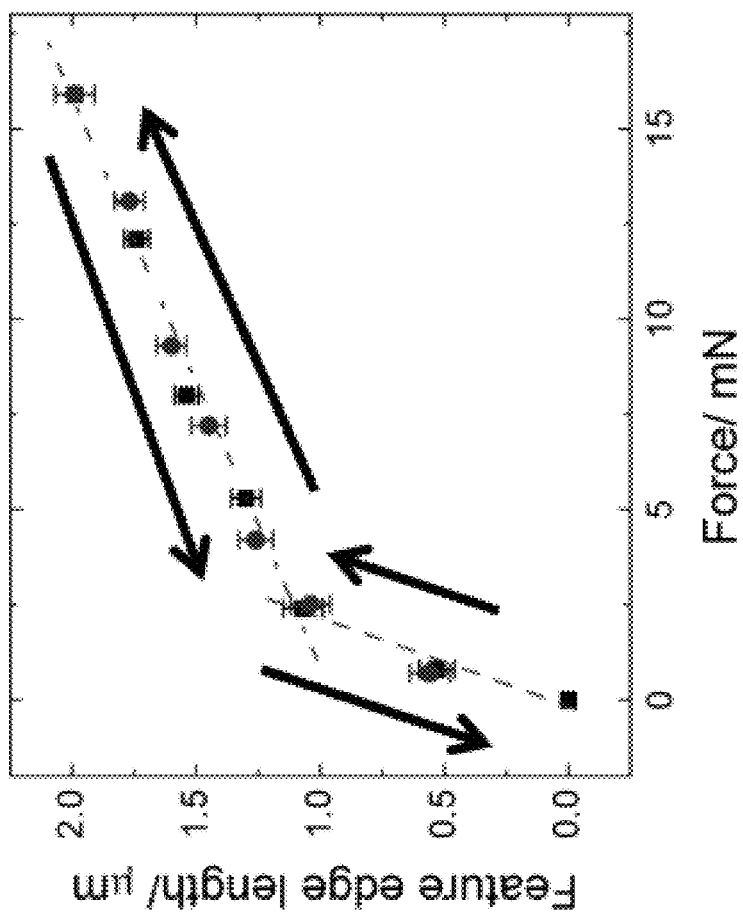
FIG. 8c is a graph illustrating the feature edge length as a function of the force exerted by the polymer pen array on the substrate surface.

The model for estimating the feature size was tested by calculating the feature size for varying amounts of force and comparing the calculated values to measured values of the features generated by printing with the polymer pen array under the application of the varying amounts of force. As shown in FIGS. 8a-8c, the model provided a good estimation of the feature sizes.

Using the above-described model, pattern elements having a predetermined feature size can be patterned using the pen arrays. A method of forming a pattern having pattern elements with a predetermined pattern element size can include choosing a pattern element size, coating a tip array with a patterning composition, choosing, based on the above-described theoretical model, a contacting pressure for contacting the coated tip array with the substrate to achieve the chosen pattern element size, and contacting the substrate surface at the chosen contacting pressure with the coated tip array to deposit the patterning composition on the substrate and form the pattern having pattern elements with the chosen pattern element size.

Patterning Compositions

For polymer pen lithography methods and cantilevered pen array lithography methods utilizing a patterning composition, the pen array can be coated with a patterning composition, for example, by immersing the pen array in a patterning solution. The patterning composition can be, for example, adsorbed or absorbed onto to the pens of the pen array. Patterning compositions suitable for use in the disclosed methods include both homogeneous and heterogeneous compositions, the latter referring to a composition having more than one component. The patterning composition is coated on the tip array. The term "coating," as used herein, refers both to coating of the tip array as well adsorption and absorption by the tip array of the patterning composition. Upon coating of the tip array with the patterning composition, the patterning composition can be patterned on a substrate surface by contacting the coated tip array with the substrate surface to deposit the patterning composition onto the substrate surface. For a description of suitable patterning compositions for use with Polymer Pen Lithography see, for example, International Patent Publication No. WO 2009/132321, the entire disclosure of which is incorporated herein by reference. For a description of suitable patterning compositions for use with Gel Pen Lithography see, for example, International Patent Application No. PCT/US2010/024631, the entire disclosure of which is incorporated herein by reference. For a description of suitable patterning compositions for use with cantilevered pen arrays see, for example, U.S. Pat. No. 6,635,311.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof. When using gel polymer pen arrays, wet inks can be directly patterned on a substrate surface. Wet inks include inks in the liquid state, including, for example, salt solutions, proteins in buffer, and etchants. The gel polymer pen array can also be used to pattern a patterning composition without the need to include patterning composition carriers in the patterning composition. For example, the patterning composition can be a biomaterial (e.g., albumin) free of exogenous carriers. Such ink carriers are known in the art, and include phospholipids, PEG, hydrogel PEG-DMA, and agarose, for example.

Patterning compositions can include materials such as, but not limited to, monolayer-forming species, thin film-forming species, oils, colloids, metals, pre-formed metal nanoparticles, metal nanoparticle precursors, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.) the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof. A hole array can be fabricated through directly etching a gold thin film with a commercial gold etchant using a gel polymer pen array. The diameter of the holes increases with increased contact time and/or applied force between the pen array and the substrate.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can also include, for example, photo-activated species. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-maleic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol) terephthalate], a poly(ethylene glycol) diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-Nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interface Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492

(1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SPIE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof. See International Patent Publication No. WO 2009/132321 and see International Patent Application No. PCT/US2010/024631, the entire disclosures of which are incorporated herein by reference for a description of examples of suitable substrates for use with Polymer Pen Lithography and Gel Pen Lithography, respectively.

The surfaces to pattern by BPL can include any suitable substrate, and preferably one which can be advantageously affected by exposure to radiation. See International Patent Application No. PCT/US2010/024633, the entire disclosure of which is incorporated herein by reference. For example, the substrate can be photosensitive or can include a photosensitive layer. For example, the photosensitive substrate or photosensitive layer can be a resist layer. The resist layer can be any known resist material, for example SHIPLEY1805 (MicroChem Inc.). Other suitable resist materials include, but are not limited to, Shipley1813 (MicroChem Inc.), Shipley1830 (MicroChem Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass ($SiO_2$), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer can have any suitable thickness, for example in a range of about 100 nm to about 5000 nm. For example, the minimum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the pen array can be modulated by modifying the resist material used and/or the thickness of the photosensitive substrate or photosensitive layer. For example, under the same radiation conditions, a thicker photosensitive layer can result in indicia having larger diameters. At constant photosensitive layer thickness, an increase in radiation intensity can results in indicia having larger diameters.

Additional aspects and details of the disclosure will be apparent from the following examples, which are intended to be illustrative rather than limiting

EXAMPLES

Example 1

Leveling a Polymer Pen Array

A method of leveling in accordance with an embodiment of the disclosure was tested using a PPL pen array mounted onto an NSCRIPTOR (NanoInk, Inc.) nanolithography platform. The polymer pen array was 1 $cm^2$, and included approximately 10000 pens, with a spacing D between tips of about 80 μm. A 25 nm thermally evaporated Au thin film with a 5 nm Ti adhesive layer on a S<100>/$SiO_x$ substrate was mounted on a force sensor (Ohaus, PS121) having a sensitivity of 0.1 mN.

The polymer pen array was leveled using a method in accordance with an embodiment of the disclosure. Specifically, the polymer pen array was brought into contact with the surface by extending the z-piezo and the total force was subsequently measured. The polymer pen array was tilted to vary $\phi$ while holding $\theta$ constant and the total force was again measured upon a $Z_0$ of 12 μm until a local maximum of total force was measured. Referring to FIG. 4a, the measured values of total force were plotted for each change in $\phi$ to determine when a local maximum of total force occurred. The local maximum of total force occurred at a change in $\phi$ of about 0.7° from the initial position of the polymer pen array in the $\phi$ direction, and corresponded to a change in total force of about 10 mN, which is within the sensitivity of the force sensor. Next, the polymer pen array was tilted to vary $\theta$ while holding $\phi$ constant at the previously determined optimized position for $\phi$, and the force was again measured until a second local maximum of total force was found. Referring to FIG. 4b, the measured values of total force were plotted for each change in $\theta$ to determine when a local maximum of total force occurred. The second local maximum of total force occurred at a change in $\theta$ of about 0.65° from the initial position of the polymer pen array in the $\theta$ direction, and corresponded to a change in total force of about 25 mN. The increase in force for the second local maximum compared to the first local maximum for nearly identical changes in angle was in agreement with the theoretical model, which predicts a steeper gradient as leveling approaches $(\theta, \phi)=(0,0)$. Finally, a global maximum of total force was found by making minute changes in $\phi$, while holding $\theta$ constant at the previously determined optimized position for $\theta$. Referring to FIG. 4c, the measured values of total force were plotted for each change in $\phi$ related to the optimized value of $\phi$ to determine when a global maximum of total force occurred. The global maximum occurred at a change in $\phi$ of about 0.06° from the previously determined optimized position of $\phi$, and corresponded to an increase in total force of about 7 mN. FIG. 4d illustrates the superimposition of the three leveling curves and demonstrates that the shape of the leveling curves matches well with the model for $F_{total}(\theta, \phi)$ described above and shown in FIG. 3.

Example 2

Printing with a Leveled Polymer Pen Array

Figures 5D, 5E:
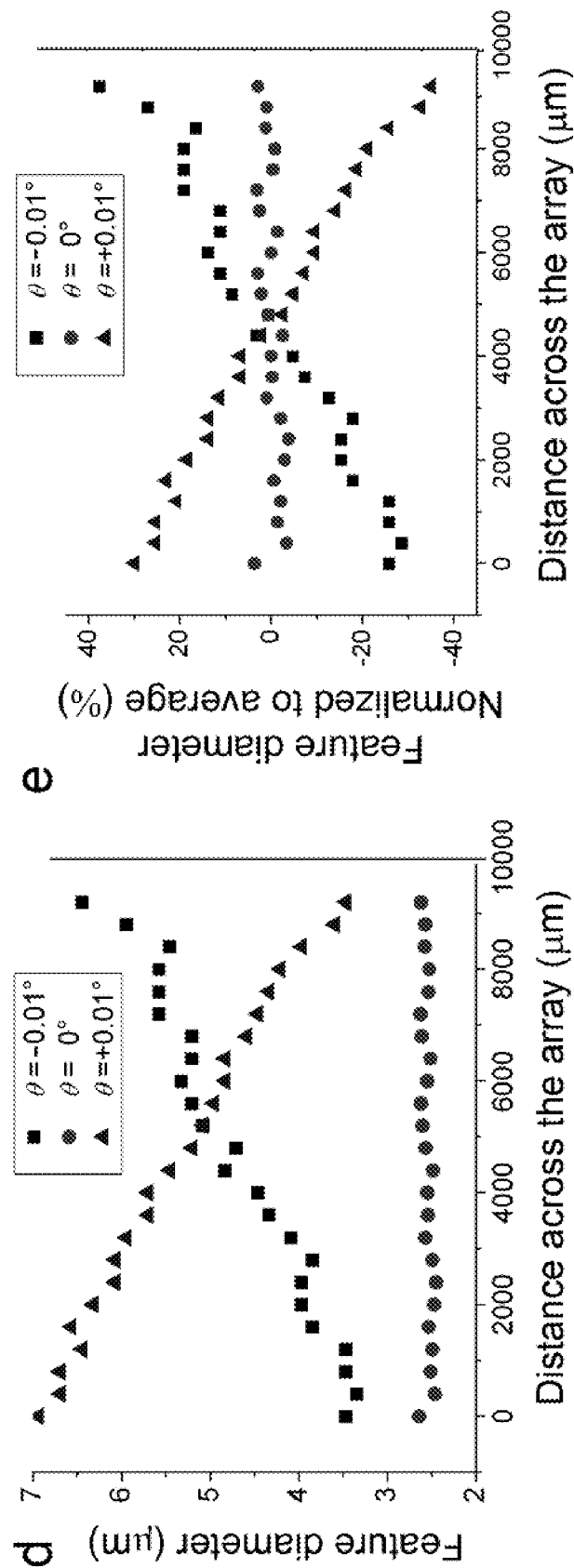
FIG. 5d is a graph illustrating the diameter of different features as a function of the distance across the polymer pen array under the different leveling conditions of FIGS. 5a-5c.
FIG. 5e is a graph illustrating the diameters of different features as a function of distance across the polymer pen array under the different leveling conditions of FIG. 5a-5c, normalized to the θ=0° condition.

Patterns of MHA on Au were written at different values of total force by adjusting $\theta$ and $\phi$ from the level position. The pens were inked with 16-mercaptohexadecanoic acid (MHA), which can form a self-assembled monolayer (SAM) on a Au surface. A 25 nm thermally evaporated Au thin film with a 5 nm Ti adhesive layer on a S<100>/$SiO_x$ substrate was mounted on a force sensor (Ohaus, PS121) having a sensitivity of 0.1 mN. The level position was determined as described in Example 1. The global maximum of total force occurred at 36 mN, and MHA dots were written on the substrate by extending the z-piezo to 10 μm, resulting in patterns in which a single dot was written by each pen in the array (FIG. 5a). The motors were adjusted to a value of $(\theta, \phi)=(0.01, 0)$, which corresponded to a total force of 33.6 mN, and a pattern of MHA dots was written on the substrate (FIG. 5b). Finally the motors were adjusted to a value of (θ, φ)=(−0.01, 0), which corresponded to a total force of 35 mN, and a pattern of MHA dots was written on the substrate (FIG. 5c). The Au was etched from areas where the MHA had not been deposited, and the resulting AU features were imaged by scanning electron microscopy (SEM). The plot of the variance of the feature edge length as a function of distance from one side of the polymer pen array for the three different curves demonstrates that patterns were written at the maximum total force were most uniform (FIG. 5d). For patterns written at the maximum total force, the average edge length was 2.54±0.05 µm, which corresponded to an approximately 2% variation from the average value. This feature size distribution is similar to that produced in single tip DPN experiments, which may be caused by small differences in pyramid shape and inhomogeneous inking of different pens of the polymer pen array. For the patterns written at (θ, φ)=(0.01, 0) or (−0.01, 0), the average feature edge lengths are 4.68±0.89 µm and 5.33±1.03 µm, respectively. For the patterns printed at a defined tilt, the error is not random, rather feature diameters either increase or decrease according to the angle of tilt between the polymer pen array and the surface, which is often the case when the pens are leveled by optical methods.

The foregoing describes and exemplifies aspects of the invention, but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

All patents, publications and references cited herein are hereby fully incorporated by reference. In case of conflict between the present disclosure and incorporated patents, publications and references, the present disclosure should control.

What is claimed:

1. A method of leveling a pen array, comprising:
   (a) contacting a pen array with a surface and measuring a total force exerted on the surface by the pen array, wherein
      the surface has first and second axes, the first and second axes being parallel to the surface and perpendicular to one another,
      the pen array comprises a plurality of tips fixed to a common substrate layer, the tips and the common substrate layer being formed from an elastomeric polymer or elastomeric gel polymer, and the tips having a radius of curvature of less than about 1 µm, and
      the pen array is disposed at a first angle with respect to the first axis of the surface and a second angle with respect to the second axis of the surface;
   (b) tilting one or both of the pen array and the surface to vary the first and second angles of the pen array with respect to the surface;
   (c) measuring the total force exerted by the tilted pen array of step (b) on the surface; and
   (d) repeating steps (b) and (c) until a global maximum of the total force exerted on the surface by the pen array is measured, thereby determining first and second angles which correspond to a leveled position of the pen array with respect to the surface.

2. The method of claim 1, comprising measuring the total force exerted on the surface by the pen array by placing a force sensor under the surface.

3. The method of claim 1, wherein the first angle is varied by a tilt increment in a range of about −0.1° to about 0.1°.

4. The method of claim 1, wherein the second angle is varied by a tilt increment in a range of about −0.1° to about 0.1°.

5. The method of claim 1, comprising tilting the pen array while holding the position of the substrate constant to vary one or both of the first and second angles.

6. The method of claim 1, comprising tilting the surface while holding the position of the pen array constant to vary one or both of the first and second angles.

7. The method of claim 1, comprising tilting both the surface and the pen array to vary one or both of the first and second angles.

8. The method of claim 1, comprising tilting the pen array by providing a motor-controlled, multi-axis stage attached to the pen array, and controlling the degree of extension of one or more motors to vary one or both of the first and second, angles.

9. The method of claim 8, wherein the motor-controlled, multi-axis stage comprises first, second, and third motors, tilting the pen array to vary the first angle comprises adjusting the first motor while holding the second and third motors constant, and tilting the pen array to vary the second angle comprises adjusting the second motor while holding the first and third motors constant.

10. The method of claim 1, wherein the elastomeric polymer is polydimethylsiloxane (PDMS).

11. The method of claim 1, wherein the tips are pyramidal.

12. The method of claim 1, wherein the tips are arranged in a regular periodic pattern.

13. The method of claim 1, further comprising patterning a substrate using the pen array by coating the tips of the pen array with a patterning composition, and contacting a substrate with the coated pen array, while the coated pen array is held in the leveled position.

14. The method of claim 13, wherein the patterning composition comprises a biomaterial having an activity, and further comprising selecting a patterning composition formulation to preserve the activity of the biomaterial when depositing the patterning composition onto the substrate surface.

15. The method of claim 13, wherein the patterning composition is free of exogenous patterning composition carriers.

16. The method of claim 13, comprising coating the tips of the pen array by adsorbing and/or absorbing the patterning composition onto the tips.

17. The method of claim 13, wherein the patterning composition comprises a metal nanoparticle precursor material or pre-formed metal nanoparticles.

18. A method of forming a pattern comprising pattern elements having a predetermined pattern element size on a substrate surface, comprising:
   choosing a pattern element size;
   coating a tip array with a patterning composition, the tip array comprising a compressible elastomeric polymer comprising a plurality of non-cantilevered tips each having a radius of curvature of less than about 1 µm;
   choosing, based on a theoretical model, a contacting pressure for contacting the coated tip array with the substrate to achieve the chosen pattern element size; and contacting the substrate surface at the chosen contacting pressure with the coated tip array to deposit the patterning composition on the substrate and form the pattern having pattern elements with the chosen pattern element size.

19. The method of claim 18, wherein the theoretical model predicts pattern elements size based on a combination of an edge length at a top surface of the tips of the tip array, Poisson's ratio for the elastomeric polymer, and the total number of tips in the tip array.

20. The method of claim 19, wherein the elastomeric polymer is polydimethylsiloxane (PDMS).

21. The method of claim 19, wherein the tips are square pyramidal.

22. The method of claim 19, wherein the tips are arranged in a regular periodic pattern.

23. The method of claim 18, wherein the patterning composition comprises a biomaterial having an activity, and further comprising selecting a patterning composition formulation to preserve the activity of the biomaterial when depositing the patterning composition onto the substrate surface.

24. The method of claim 18, wherein the patterning composition is free of exogenous patterning composition carriers.

25. The method of claim 18, comprising coating the tips of the pen array by adsorbing and/or absorbing the patterning composition onto the tips.

26. The method of claim 18, wherein the patterning composition comprises a metal nanoparticle precursor material or pre-formed metal nanoparticles.

27. The method of claim 1, wherein tilting and measuring until a global maximum of the total force is measured comprises:
  (i) tilting one or both of the pen array and the surface to vary the first angle of the pen array by a first angle tilt increment while holding the second angle of the pen array constant and measuring the total force exerted by the pen array on the surface;
  (ii) repeating step (i) until a first local maximum of the total force exerted on the surface by the pen array is measured, thereby determining an optimized first angle of the pen array;
  (iii) tilting one or both of the pen array and the surface to vary the second angle of the pen array by a second angle tilt increment while holding the first angle of the pen array constant at the optimized first angle and measuring the total force exerted by the pen array on the surface; and
  (iv) repeating step (iii) until a second local maximum of the total force exerted on the surface by the pen array is measured, thereby determining an optimized second angle of the pen array.

28. The method of claim 27, further comprising (v) tilting one or both of the pen array and the surface to vary the optimized first angle of the pen array by an optimized first angle tilt increment while holding the second angle of the pen array constant at the optimized second angle and measuring the total force exerted by the pen array on the surface; and
  (vi) repeating step (v) until the global maximum of the total force exerted on the surface by the pen array is measured.

29. The method of claim 28, wherein the optimized first angle tilt increment is in a range of about −0.1° to about 0.1°.

30. A method of leveling a cantilevered pen array, comprising:
  (a) contacting a cantilevered pen array with a surface and measuring a total force exerted on the surface by the cantilevered pen array, wherein
    the surface has first and second axes, the first and second axes being parallel to the surface and perpendicular to one another,
    the cantilevered pen array comprises a plurality of cantilevers supported by a common support structure, and
    the cantilevered pen array is disposed at a first angle with respect to the first axis of the surface and a second angle with respect to the second axis of the surface;
  (b) tilting one or both of the cantilevered pen array and the surface to vary the first and second angles of the cantilevered pen array with respect to the surface;
  (c) measuring the total force exerted by the tilted cantilevered pen array of step (b) on the surface; and
  (d) repeating steps (b) and (c) until a global maximum of the total force exerted on the surface by the cantilevered pen array is measured, thereby determining first and second angles which correspond to a leveled position of the cantilevered pen array with respect to the surface.

31. The method of claim 30, comprising measuring the total force exerted on the surface by the cantilevered pen array by placing a force sensor under the surface.

32. The method of claim 30, wherein the first angle is varied by a tilt increment in a range of about −0.1° to about 0.1°.

33. The method of claim 30, wherein the second angle is varied by a tilt increment in a range of about −0.1° to about 0.1°.

34. The method of claim 30, comprising tilting the cantilevered pen array while holding the position of the substrate constant to vary one or both of the first and second angles.

35. The method of claim 30, comprising tilting the surface while holding the position of the cantilevered pen array constant to vary one or both of the first and second angles.

36. The method of claim 30, comprising tilting both the surface and the cantilevered pen array to vary one or both of the first and second angles.

37. The method of claim 30, wherein the cantilevered pen array comprises tips fixed to one or more of the cantilevers.

38. The method of claim 37, further comprising patterning a substrate using the cantilevered pen array by coating the tips of the cantilevered pen array with a patterning composition, and contacting a substrate with the coated cantilevered pen array, while the coated cantilevered pen array is held in the leveled position.

39. The method of claim 30, wherein the tilting and measuring until a global maximum of the total force is measured comprises:
  (i) tilting one or both of the cantilevered pen array and the surface to vary the first angle of the cantilevered pen array by a first angle tilt increment while holding the second angle of the cantilevered pen array constant and measuring the total force exerted by the cantilevered pen array on the surface;
  (ii) repeating step (i) until a first local maximum of the total force exerted on the surface by the cantilevered pen array is measured, thereby determining an optimized first angle of the cantilevered pen array;
  (iii) tilting one or both of the cantilevered pen array and the surface to vary the second angle of the cantilevered pen array by a second angle tilt increment while holding the first angle of the cantilevered pen array constant at the optimized first angle and measuring the total force exerted by the cantilevered pen array on the surface; and (iv) repeating step (iii) until a second local maximum of the total force exerted on the surface by the cantilevered pen array is measured, thereby determining an optimized second angle of the cantilevered pen array.

40. The method of claim 39, further comprising (v) tilting one or both of the cantilevered pen array and the surface to vary the optimized first angle of the pen array by an optimized first angle tilt increment while holding the second angle of the cantilevered pen array constant at the optimized second angle and measuring the total force exerted by the cantilevered pen array on the surface; and (vi) repeating step (v) until a global maximum of the total force exerted on the surface by the cantilevered pen array is measured.

41. The method of claim 40, wherein the optimized first angle tilt increment is in a range of about −0.1° to about 0.1°.

* * * * *